(12) United States Patent
Shinozuka et al.

(10) Patent No.: US 12,204,024 B2
(45) Date of Patent: Jan. 21, 2025

(54) LIGHT RECEIVING DEVICE AND DISTANCE MEASURING DEVICE

(71) Applicant: Sony Semiconductor Solutions Corporation, Kanagawa (JP)

(72) Inventors: Yasuhiro Shinozuka, Kanagawa (JP); Hayato Kamizuru, Kagoshima (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 1073 days.

(21) Appl. No.: 16/979,483

(22) PCT Filed: Mar. 6, 2019

(86) PCT No.: PCT/JP2019/008791
§ 371 (c)(1),
(2) Date: Sep. 9, 2020

(87) PCT Pub. No.: WO2019/176673
PCT Pub. Date: Sep. 19, 2019

(65) Prior Publication Data
US 2021/0041540 A1     Feb. 11, 2021

(30) Foreign Application Priority Data

Mar. 16, 2018    (JP) .................................. 2018-049178

(51) Int. Cl.
*G01S 7/4863*        (2020.01)
*G01S 7/4865*        (2020.01)
(Continued)

(52) U.S. Cl.
CPC ............ *G01S 17/10* (2013.01); *G01S 7/4863* (2013.01); *G01S 7/4865* (2013.01); *G01S 17/89* (2013.01);
(Continued)

(58) Field of Classification Search
CPC ...... G01S 7/4863; G01S 7/4865; G01S 17/10; G01S 17/89; G01S 17/931; G01S 17/36; H01L 31/02027
(Continued)

(56) References Cited

U.S. PATENT DOCUMENTS 5,187,538 A  *  2/1993  Iwamoto ................. G01S 11/12
                                                356/450
9,313,476 B2 *  4/2016  Sun ....................... H04N 13/254
(Continued)

FOREIGN PATENT DOCUMENTS

CN        203981883 U     12/2014
CN        105374832 A      3/2016
(Continued)

OTHER PUBLICATIONS

"Positice logic, negative logic, and logic circuit conversion," O'Reilly, 2024, 3 pp. (Year: 2024).*
(Continued)

*Primary Examiner* — Daniel L Murphy
(74) *Attorney, Agent, or Firm* — Wolf, Greenfield & Sacks, P.C.

(57) ABSTRACT

A light receiving device of the present disclosure includes: a pixel array unit having a plurality of pixels $50_1$ to $50_4$ each including a light receiving unit $50_1$ to $50_4$ that generates a signal according to reception of photons; a first switch unit that $61_1$ to $61_4$ recharges the light receiving unit $50_1$ to $50_4$; and a recharge control unit 64 that controls the first switch unit $61_1$ to $61_4$ according to output of the light receiving unit $50_1$ to $50_4$, and the recharge control unit 64 is shared among the plurality of pixels $50_1$ to $50_4$. By this sharing of the recharge control unit 64, since the circuit area of the circuit unit 60 per pixel can be reduced, the aperture ratio can be increased while miniaturizing the pixel 50. Preferably, the
(Continued)

recharge control unit 64 includes a four-input OR circuit 641 and a recharge signal generation circuit 642. The OR circuit 641 obtains the OR of the logic signals retrieved from each cathode electrode of the SPAD sensors $50_1$ to $50_4$ supplied through the comparators $63_1$ to $63_4$. The OR output of the OR circuit 641 is supplied to the recharge signal generation circuit 642. The recharge signal generation circuit 642 generates the recharge signal RCHG by delaying the OR output of the OR circuit 641 by a predetermined delay time, and supplies the recharge signal RCHG to the first switch units $61_1$ to $61_4$. As a result, the recharge control unit 64 performs the recharge control in response to the OR signal of the logic signal whose logic is inverted at the time when photons are incident on one or more of the SPAD sensors $50_1$ to $50_4$. Furthermore, a distance measuring device of the present disclosure includes: a light source that irradiates an object to be measured with light; and a light receiving device that receives light reflected by the object to be measured, and the light receiving device includes the light receiving device having the above configuration.

20 Claims, 18 Drawing Sheets

(51) Int. Cl.
*G01S 17/10* (2020.01)
*G01S 17/89* (2020.01)
*H01L 31/02* (2006.01)
*G01S 17/931* (2020.01)

(52) U.S. Cl.
CPC ...... *H01L 31/02027* (2013.01); *G01S 17/931* (2020.01)

(58) Field of Classification Search
USPC .......................................................... 356/4.01
See application file for complete search history.

(56) References Cited

U.S. PATENT DOCUMENTS

| | | | |
|---|---|---|---|
| 9,677,931 B2* | 6/2017 | Shaber | G01T 1/20185 |
| 10,332,930 B2* | 6/2019 | Rae | H01L 27/14643 |
| 2011/0057736 A1 | 3/2011 | Badillo | |
| 2016/0044296 A1 | 2/2016 | Sun et al. | |
| 2017/0030769 A1 | 2/2017 | Clemens et al. | |
| 2017/0176250 A1 | 6/2017 | Rae | |
| 2018/0246214 A1 | 8/2018 | Ishii et al. | |

FOREIGN PATENT DOCUMENTS

| | | |
|---|---|---|
| EP | 3 287 813 A1 | 2/2018 |
| JP | 2017-073550 A | 4/2017 |
| WO | WO 2017/098725 A1 | 6/2017 |

OTHER PUBLICATIONS

International Search Report and Written Opinion mailed May 22, 2019 in connection with International Application No. PCT/JP2019/008791.

* cited by examiner

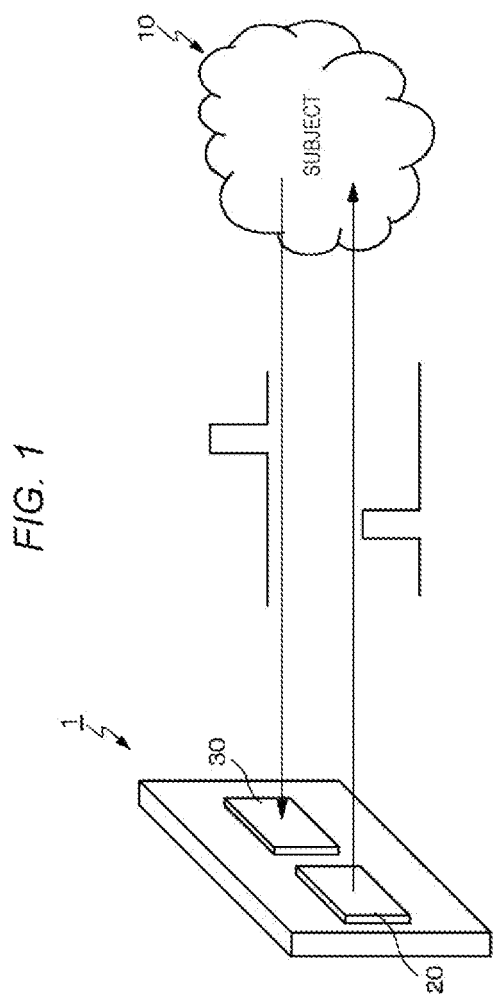

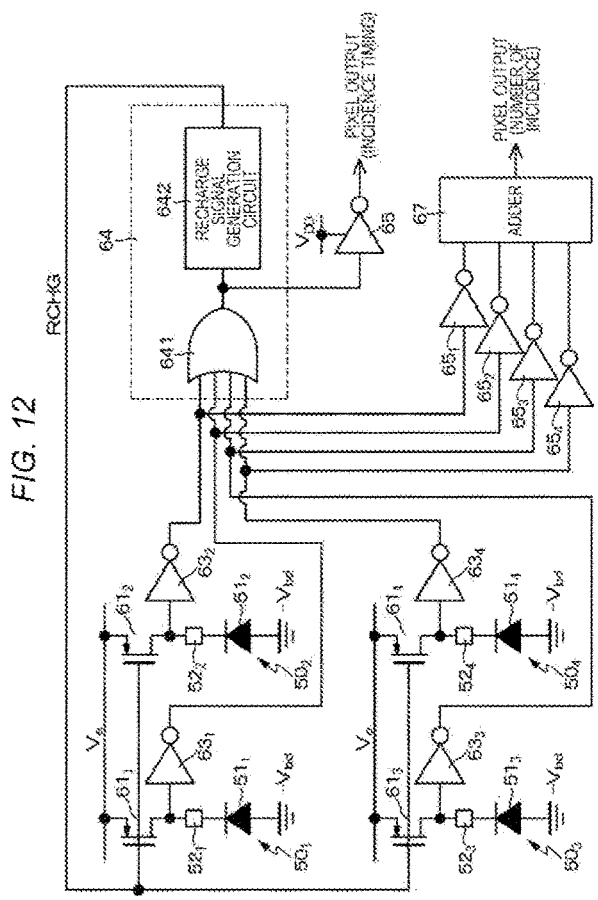
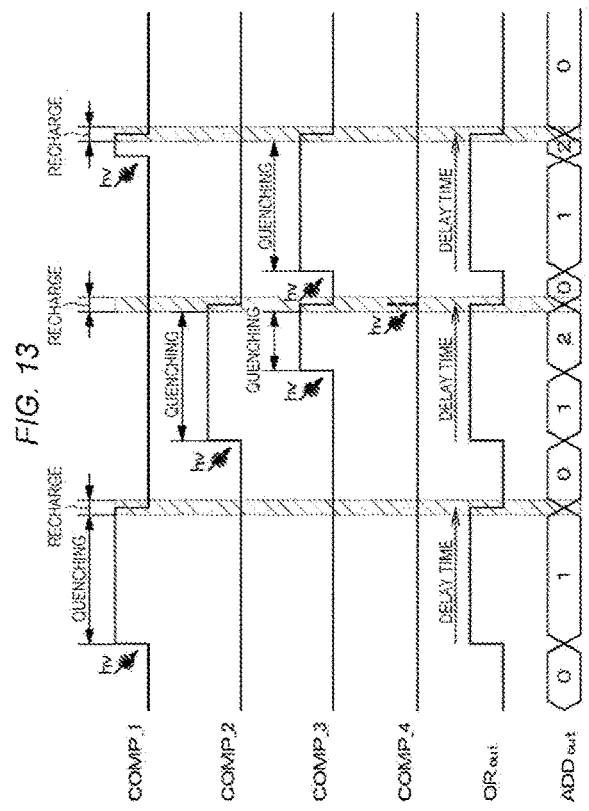
FIG. 12
FIG. 13

*FIG. 23A*

| $D_0$ | $D_1$ | DELAY TIME |
|---|---|---|
| 0 | 0 | $td_0$ |
| 0 | 1 | $td_1$ |
| 1 | 1 | $td_2$ |

| $D_0$ | $D_1$ | DELAY TIME |
|---|---|---|
| 0 | 0 | $td_0$ |
| 0 | 1 | $td_1$ |
| 1 | 1 | $td_2$ |

$td_0 < td_1 < td_2$

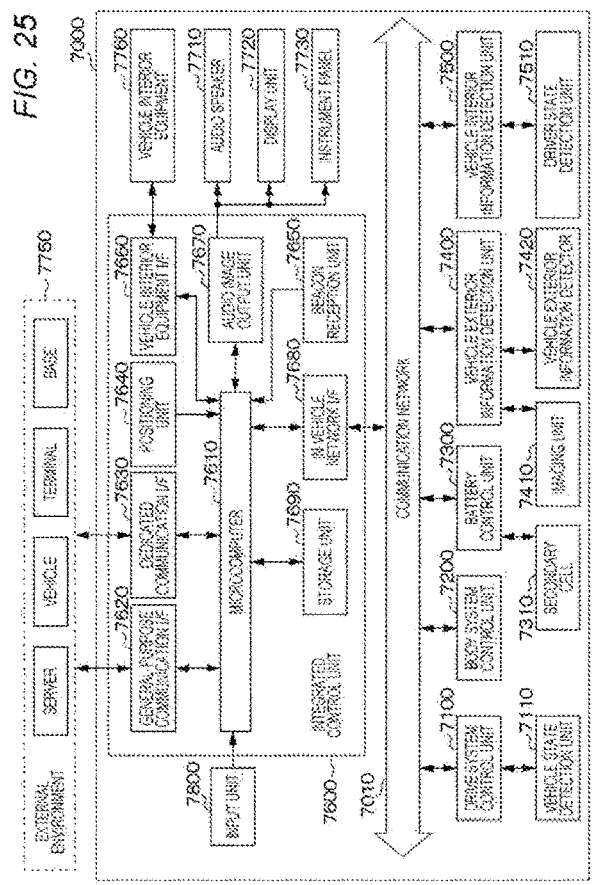

LIGHT RECEIVING DEVICE AND DISTANCE MEASURING DEVICE

CROSS-REFERENCES TO RELATED APPLICATIONS

This application claims the benefit under 35 U.S.C. § 371 as a U.S. National Stage Entry of International Application No. PCT/JP2019/008791, filed in the Japanese Patent Office as a Receiving Office on Mar. 6, 2019, which claims priority to Japanese Patent Application Number JP2018-049178, filed in the Japanese Patent Office on Mar. 16, 2018, each of which is hereby incorporated by reference in its entirety.

TECHNICAL FIELD

The present disclosure relates to a light receiving device and a distance measuring device.

BACKGROUND ART

In recent years, miniaturization of pixels has been advanced for the purpose of downsizing a chip size in a light receiving device in which pixels including a light receiving unit are two-dimensionally arranged in a matrix. Furthermore, in order to miniaturize a pixel, a circuit element such as a transistor forming a pixel is shared among a plurality of pixels to reduce the number of circuit elements per pixel (see, for example, PTL 1).

CITATION LIST

Patent Literature

PTL 1: JP 2017-73550A

SUMMARY

Technical Problem

Incidentally, as one of light receiving units of pixels, there is a light sensor that generates a signal according to reception of photons. In the light receiving device using this light sensor, it is necessary to provide a switch unit that precharges the light sensor and a recharge control unit that controls the switch unit for each pixel. Therefore, even if a pixel is miniaturized, since the circuit area including the switch unit and the recharge control unit provided for each pixel is not reduced, the aperture ratio of the pixel is lowered.

Accordingly, the present disclosure provides a light receiving device capable of improving the aperture ratio of pixels while reducing the circuit area per pixel and achieving miniaturization of pixels, and a distance measuring device using the light receiving device.

Solution to Problem

According to an embodiment of the present disclosure, there is provided a light receiving device including:
a pixel array unit having a plurality of pixels each including a light receiving unit that generates a signal according to reception of photons;
a first switch unit that recharges the light receiving unit; and
a recharge control unit that controls the first switch unit according to output of the light receiving unit,
the recharge control unit being shared among the plurality of pixels.

Furthermore, according to another embodiment of the present disclosure, there is provided a distance measuring device (distance measurement device) including:
a light source that irradiates an object to be measured with light; and
a light receiving device that receives light reflected by the object to be measured.
Then, there is provided a light receiving device including:
a pixel array unit arranged with a plurality of pixels each including a light receiving unit;
a first switch unit that recharges the light receiving unit; and
a recharge control unit that controls the first switch unit according to output of the light receiving unit,
the recharge control unit being shared among the plurality of pixels.

Advantageous Effects of Invention

According to the present disclosure, since the circuit area per pixel can be reduced, the pixel aperture ratio can be improved while miniaturizing pixels.

Note that, the effect described herein is not necessarily limited, and any of the effects described in this specification may be used. Furthermore, the effects described in this specification are merely examples, and the present disclosure is not limited thereto, and may have additional effects.

BRIEF DESCRIPTION OF DRAWINGS

FIG. 1 is a schematic configuration diagram showing a distance measuring device according to an embodiment of the present disclosure.

FIG. 12 is a circuit diagram showing a circuit configuration of a light receiving device according to a sixth embodiment.

FIG. 13 is a timing waveform diagram for explaining circuit operation of the light receiving device according to the sixth embodiment.

FIG. 23A is a diagram showing a truth table of the asymmetric delay element according to the twelfth embodiment, and FIG. 23B is a diagram showing a truth table of the asymmetric delay element according to a thirteenth embodiment.

FIG. 25 is a block diagram showing a schematic configuration example of a vehicle control system which is an example of a mobile body control system to which the technology according to the present disclosure can be applied.

FIG. 26 is a diagram showing an example of an installation position of the distance measuring device.

DESCRIPTION OF EMBODIMENTS

Figure 2A:
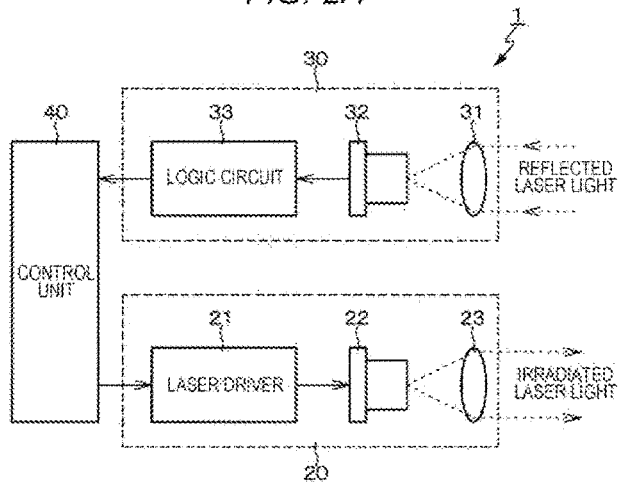
FIGS. 2A and 2B are block diagrams showing a specific configuration of the distance measuring device according to an embodiment of the present disclosure.

Hereinafter, modes for implementing the technology of the present disclosure (hereinafter referred to as "embodiments") will be described in detail with reference to the drawings. The technology of the present disclosure is not limited to the embodiments. In the following description, the same reference numerals will be used for the same elements or elements having the same function, and redundant description will be omitted. Note that the description will be given in the following order.

1. Explanation of light receiving device and distance measuring device of the present disclosure in general
2. Measuring device according to embodiments
3. Basic configuration of light receiving device using SPAD sensor
4. Light receiving device according to embodiments
4-1. First embodiment (example of retrieving signal from cathode electrode side)
4-2. Second embodiment (example of retrieving signal from anode electrode side)
4-3. Third embodiment (modification of first embodiment: example of another circuit configuration of four-input OR circuit)
4-4. Fourth embodiment (modification of first embodiment: first example of method of retrieving pixel output)
4-5. Fifth embodiment (modification of first embodiment: second example of method of retrieving pixel output)
4-6. Sixth embodiment (modification of fourth embodiment: example of detecting number of incident photons)
4-7. Seventh embodiment (modification of first embodiment: example of retrieving pixel output for each pixel)
4-8. Eighth embodiment (example of chip structure of light receiving device)
4-9. Ninth embodiment (first example in which recharge signal generation circuit includes ring oscillator)
4-10. Tenth embodiment (second example in which recharge signal generation circuit includes ring oscillator)
4-11. Eleventh embodiment (example of asymmetric delay element constituting ring oscillator)
4-12. Twelfth embodiment (modification of eleventh embodiment: example of changing the number of series of elements having high on-resistance)
4-13. Thirteenth embodiment (modification of eleventh embodiment: example of changing the number of parallel of elements having high on-resistance)
5. Application example of technology according to the present disclosure (example of mobile body)
6. Configuration that the present disclosure can take <Explanation of Light Receiving Device and Distance Measuring Device of the Present Disclosure in General>

In the light receiving device and the distance measuring device of the present disclosure, the recharge control unit can be configured to, in a case where photons are incident on one or more light receiving units among light receiving units of a plurality of pixels that share a recharge control unit, perform recharging for all of the light receiving units of the plurality of pixels. Furthermore, the recharge control unit can have an OR circuit that takes the OR of logic signals whose logic is inverted at the time when photons are incident on one or more light receiving units, and can be configured to perform recharging according to an OR signal of the OR circuit.

The light receiving device and the distance measuring device of the present disclosure including the preferable configuration described above can have a configuration in which the light receiving unit includes a single photon avalanche diode. At this time, a configuration can be adopted in which a signal is retrieved from a cathode electrode side of the single photon avalanche diode, or a configuration can be adopted in which a signal is retrieved from an anode electrode side.

Furthermore, the light receiving device and the distance measuring device of the present disclosure including the preferable configuration described above can have a level conversion unit that converts the level of the OR signal of the OR circuit, and can be configured to output a conversion result of the level conversion unit as information for detecting the photon incidence timing. Alternatively, the light receiving device and the distance measuring device can have an exclusive OR circuit that retrieves the exclusive OR of logic signals whose logic is inverted at the time when photons are incident on one or more light receiving units, and a level conversion unit that converts the level of the exclusive OR signal of the exclusive OR circuit, and can be configured to output the conversion result of the level conversion unit as information for detecting the photon incidence timing.

Furthermore, the light receiving device and the distance measuring device of the present disclosure including the preferable configuration described above can have an adder that adds the number of photons incident on a plurality of pixels sharing the recharge control unit, and can be configured to output an addition result of the adder as information for detecting the number of incident photons. Alternatively, each of the input signals of the OR circuit can have a waveform shaping unit that performs processing for increasing the pulse width and outputs the result.

Furthermore, the light receiving device and the distance measuring device of the present disclosure including the preferable configuration described above can have a quenching circuit that lowers the applied voltage with respect to the single photon avalanche diode to the breakdown voltage. Then, the quenching circuit can have a second switch unit connected in parallel to a first switch unit, and can be configured to operate according to the output of the light receiving unit.

Furthermore, in the light receiving device and the distance measuring device according to an embodiment of the present disclosure including the preferable configuration described above, the recharge control unit can have a recharge signal generation circuit that generates a recharge signal for driving the first switch unit. Then, the recharge signal generation circuit can use a ring oscillator. Furthermore, the ring oscillator can be configured by using an asymmetric delay element having different rising delay time and falling delay time.

Furthermore, in the light receiving device and the distance measuring device of the present disclosure including the preferable configuration described above, the asymmetric delay element can include a CMOS inverter, and have a P-channel field effect transistor and an N-channel field effect transistor having different sizes. Furthermore, a configuration can be adopted in which the delay time of the asymmetric delay element can be varied.

Furthermore, in the light receiving device and the distance measuring device of the present disclosure including the preferable configuration described above, a configuration can be adopted in which, the number of series connections of the transistor having higher on-resistance among the P-channel field effect transistor and the N-channel field effect transistor is variable, and the delay time is set according to the number of series connections. Alternatively, a configuration may be adopted in which the number of parallel connections of the transistor having higher on-resistance is variable, and the delay time can be set according to the number of parallel connections.

Furthermore, the light receiving device and the distance measuring device according to an embodiment of the present disclosure including the preferable configuration described above can have a stacked structure in which a first semiconductor substrate on which the light receiving unit is arranged and a second semiconductor substrate on which the recharge control unit is arranged are stacked.

<Measuring Device According to Embodiments>

FIG. 1 is a schematic configuration diagram showing a distance measuring device according to an embodiment of the present disclosure. In a distance measuring device 1 according to the present embodiment, as a measuring method for measuring the distance to a subject 10 which is a measuring object, the time of flight (TOF) method is adopted which measures the time until light (for example, laser light) emitted toward the subject 10 is reflected by the subject 10 and returns. In order to realize the distance measurement by the TOF method, the distance measuring device 1 according to the present embodiment includes a light source 20 and a light receiving device 30. Then, as the light receiving device 30, a light receiving device according to an embodiment of the present disclosure which will be described later is used.

Figure 2B:
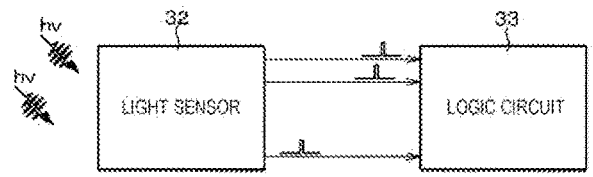

Specific configurations of the distance measuring device 1 according to the present embodiment are shown in FIGS. 2A and 2B. The light source 20 has, for example, a laser driver 21, a laser light source 22, and a diffusing lens 23, and irradiates the subject 10 with laser light. The laser driver 21 drives the laser light source 22 under the control of a control unit 40. The laser light source 22 includes, for example, a semiconductor laser, and emits laser light when driven by the laser driver 21. The diffusing lens 23 diffuses the laser light emitted from the laser light source 22 and irradiates the subject 10.

The light receiving device 30 has a light receiving lens 31, a light sensor 32, and a logic circuit 33, and receives reflected laser light that is the irradiated laser light emitted by the laser irradiation unit 20 being reflected by the subject 10 and returning. The light receiving lens 31 condenses the reflected laser light from the subject 10 onto a light receiving surface of the light sensor 32. The light sensor 32 receives the reflected laser light from the subject 10 that has passed through the light receiving lens 31 in units of pixels and performs photoelectric conversion.

An output signal of the light sensor 32 is supplied to the control unit 40 via the logic circuit 33. Details of the light sensor 32 will be described later. The control unit 40 is constituted by, for example, a central processing unit (CPU) or the like, and controls the light source 20 and the light receiving device 30, and measures time t until the laser light emitted from the light source 20 toward the subject 10 is reflected by the subject 10 and returns. On the basis of this time t, distance L to the subject 10 can be obtained. As a time measurement method, a timer is started at the timing of emitting pulse light from the light source 20, the timer is stopped at the timing when the light receiving device 30 receives the pulse light, and the time t is measured. As another time measurement method, pulse light is emitted from the light source 20 at a predetermined cycle, a cycle when the light receiving device 30 receives the pulse light is detected, and the time t may be measured from the phase difference between the light emission cycle and the light reception cycle.

As the light sensor 32, a two-dimensional array sensor (so-called area sensor) in which pixels including a light receiving unit are arranged in a two-dimensional array can be used, or a one-dimensional array sensor (so-called line sensor) in which pixels including a light receiving unit are linearly arranged can also be used.

In addition, in this embodiment, as the light sensor 32, a sensor is used in which the light receiving unit of the pixel includes an element that generates a signal in response to the reception of photons, for example, a single photon avalanche diode (SPAD) element. That is, in the light receiving device 30 according to the present embodiment, the light receiving unit of the pixel includes the SPAD sensor. Note that, the light receiving unit is not limited to the SPAD element, and may be various elements such as an avalanche photo diode (APD).

<Basic Configuration of Light Receiving Device Using SPAD Sensor>

Figure 3:
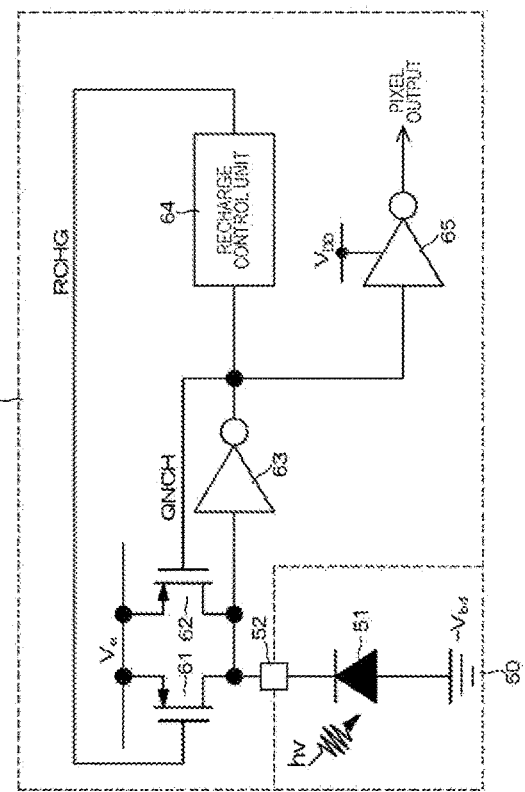
FIG. 3 is a circuit diagram showing a basic configuration of one pixel of a light receiving device using a SPAD sensor.

FIG. 3 shows a basic configuration of the light receiving device 30 using a SPAD sensor. Here, the basic configuration for one pixel is shown.

A pixel 50 uses the SPAD sensor 51 as a light receiving unit. The SPAD sensor 51 has a cathode electrode connected to a terminal 52 and an anode electrode connected to a low potential-$V_{bd}$ (for example, −10V) side power supply, and generates a signal, specifically, a pulse signal in response to the reception of a photon hv. The SPAD sensor 51 is a high-performance light sensor capable of detecting incidence of single photon with photon detection efficiency (PDE).

Figure 4A:
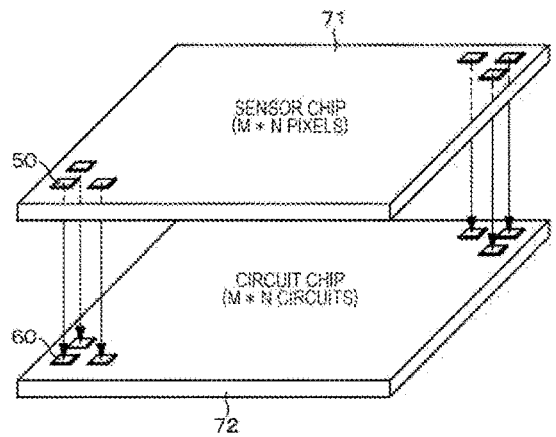
FIG. 4A is an exploded perspective view of a stacked structure of a sensor chip and a circuit chip.

As shown in FIG. 4A, the pixels 50 including the SPAD sensor 51 are arranged in a two-dimensional array of M rows and N columns on the first semiconductor substrate to constitute a pixel array unit. The first semiconductor substrate in which the pixels 50 are arranged constitutes a sensor chip 71. This sensor chip 71 corresponds to the light sensor 32 in FIG. 2A.

A circuit unit 60 is provided for each pixel 50. The circuit unit 60 includes a first switch unit 61, a second switch unit 62, a comparator 63, a recharge control unit 64, and a level conversion unit 65. In the circuit unit 60, the first switch unit 61, the second switch unit 62, and the comparator 63 constitute the pixel 50 together with the SPAD sensor 51.

The first switch unit 61 is constituted by, for example, a P-channel type field effect transistor, is connected between a high-potential $V_e$ side power supply and the terminal 52, and is a recharge switch that operates according to a recharge signal RCHG provided from the recharge control unit 64. The first switch unit 61 recharges the SPAD sensor 51 in response to the recharge signal RCHG.

The second switch unit 62 is connected in parallel to the first switch unit 61 and constitutes a quenching circuit that performs quenching operation according to the output of the SPAD sensor 51, more specifically, the output of the comparator 63. The second switch unit 62 as a quench switch stops the avalanche phenomenon by lowering the voltage applied to the SPAD sensor 51 to the breakdown voltage by the quenching operation.

The comparator 63 converts the cathode potential of the SPAD sensor 51 to a logic level. A logic signal output from the comparator 63 is supplied to the second switch unit 62 as a quench signal QNCH and is also supplied to the recharge control unit 64 and the level conversion unit 65.

The recharge control unit 64 generates the recharge signal RCHG on the basis of the logic signal output from comparator 63. Then, the recharge control unit 64 performs on/off control of the first switch unit 61 on the basis of the recharge signal RCHG.

The level conversion unit 65 is a level-down circuit that levels down the potential $V_e$ of the logic level output from the comparator 63 to the power supply potential $V_{DD}$ (for example, about 1.1V) of the logic circuit 33 (see FIG. 2B) in the subsequent stage. The potential level-downed by the level conversion unit 65 is derived as a pixel output. In the logic circuit 33 at the subsequent stage, processing such as edge detection of the pixel output output from the level conversion unit 65 is performed.

Figure 4B:
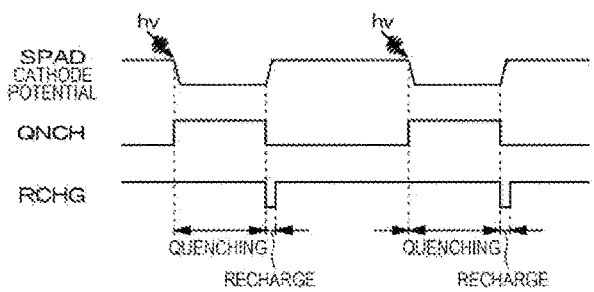
FIG. 4B is a timing waveform diagram showing timing relationships among a cathode potential of the SPAD sensor, a quench signal QNCH, and a recharge signal RCHG.

FIG. 4B shows timing relationships among the cathode potential of the SPAD sensor 51, the quench signal QNCH, and the recharge signal RCHG.

When photons are incident on the SPAD sensor 51, a current flows through the SPAD sensor 51 by avalanche amplification, and the cathode potential of the SPAD sensor 51 decreases. In addition, when the cathode potential of the SPAD sensor 51 exceeds the comparison reference value (threshold value) of the comparator 63, the logic of the quench signal QNCH changes from 0 to 1. In response to this, the second switch unit 62 is turned off, so that the quenching operation is performed.

Since the cathode potential of the SPAD sensor 51 is lowered to around 0V by the quenching operation by the second switch unit 62, the avalanche amplification stops. Then, as the logic of the recharge signal RCHG changes from 1 to 0 to 1, the first switch unit 61 is turned on to recharge the SPAD sensor 51. As a result, the cathode potential of the SPAD sensor 51 rises to $V_e$, and the SPAD sensor 51 returns to the initial state.

A series of operation described above, that is, a series of operation of current flowing in the SPAD sensor 51, potential decreasing of the cathode potential of the SPAD sensor 51, quenching, and recharging of the SPAD sensor 51 is repeated each time a photon enters the SPAD sensor 51.

The circuit unit 60 having the above-described configuration is arranged in a two-dimensional array of M rows and N columns on the second semiconductor substrate. The second semiconductor substrate in which the circuit unit 60 is arranged constitutes a circuit chip 72. The circuit chip 72 is stacked on the sensor chip 71. Thereby, in the stacked structure of the sensor chip 71 and the circuit chip 72, the circuit unit 60 is provided for each one pixel 50. In other words, the occupied area of one pixel 50 and the occupied area of one circuit unit 60 are substantially equal.

Incidentally, in recent years, miniaturization of the pixel 50 has been advanced for the purpose of downsizing the chip size. However, as described above, in a case where the occupied areas of the pixel 50 and the circuit unit 60 are about the same and the relationship between the pixel 50 and the circuit unit 60 is in a one-to-one relationship, even if the pixel 50 is miniaturized, the occupied area (circuit area) of the circuit unit 60 does not decrease, so that the aperture ratio of the pixel 50 decreases. In other words, the circuit area of the circuit unit 60 becomes a bottleneck for miniaturization of the pixel 50.

<Light Receiving Device According to Embodiments>

In the present embodiment, in the light receiving device 30 having the first switch unit 61 that recharges the SPAD sensor 51 and the recharge control unit 64 that controls the SPAD sensor 51 according to the output of the SPAD sensor 51, the recharge control unit 64 is shared among the plurality of pixels 50.

The recharge control unit 64 is shared among the plurality of pixels 50 in this way, so that, since the circuit area of the circuit unit 60 per pixel can be reduced, the aperture ratio can be increased while miniaturizing the pixel 50. Furthermore, in a case of a stacked structure (see FIG. 4A) in which the sensor chip 71 and the circuit chip 72 are stacked, since the circuit area of the circuit unit 60 per pixel can be reduced, the pixel 50 is miniaturized, and further, the size of the chip size can be reduced or the number of pixels can be increased.

However, the technology of the present disclosure is not limited to application to the stacked structure. In other words, the technology of the present disclosure is also applicable to a so-called flat structure in which the circuit unit 60 is arranged on the same semiconductor substrate as the pixel array unit in which the pixels 50 are arranged. Details of the chip structure of the stacked structure and the flat structure will be described later.

Hereinafter, a specific example of the light receiving device 30 according to the present embodiment will be described.

First Embodiment

Figure 5:
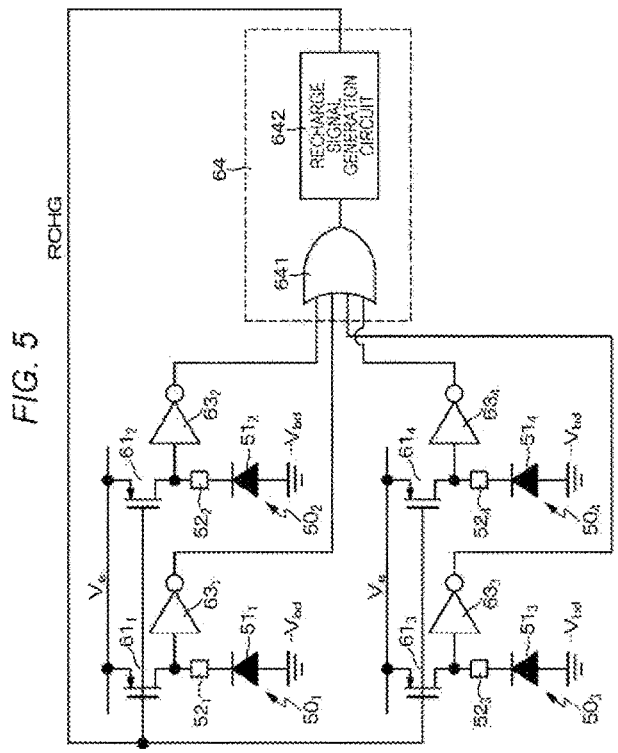
FIG. 5 is a circuit diagram showing a circuit configuration of a light receiving device according to a first embodiment.

A first embodiment is an example of retrieving a signal from a cathode electrode side of the SPAD sensor 51. FIG. 5 is a circuit configuration of the light receiving device 30 according to the first embodiment.

Here, a case where the recharge control unit 64 is shared among four pixels $50_1$ to $50_4$ is illustrated. The four pixels $50_1$ to $50_4$ are four pixels of two columns×two rows adjacent to each other in the column direction and the row direction in a matrix pixel array. However, the number of pixels sharing the recharge control unit 64 is not limited to four pixels. This point is similar in each of the embodiments described later. Furthermore, the second switch unit 62 as a quench switch provided for each SPAD sensor 51 is not shown for the sake of simplicity of the drawing. This is similar in each of the embodiments described later.

In the pixel $50_1$, the SPAD sensor $51_1$ has a cathode electrode connected to a terminal $52_1$ and an anode electrode connected to a low potential $(-V_{bd})$ side power supply, respectively. Then, the signal of the SPAD sensor $51_1$ is retrieved through the terminal $52_1$ from the cathode electrode side. This is similar in the other SPAD sensors $51_2$ to $51_4$.

A first switch unit $61_1$ serving as a recharge switch is constituted by, for example, a P-channel type field effect transistor, is connected between a high-potential $(V_e)$ side power supply and the terminal 52, and operates according to a recharge signal RCHG provided from the recharge control unit 64. This is similar in the other first switch units $61_2$ to $61_4$.

Signals retrieved from each cathode electrode of the SPAD sensors $51_1$ to $51_4$ through the terminals $52_1$ to $52_4$ are converted to the logical level by comparators $63_1$ to $63_4$ and then supplied to an input end of the recharge control unit 64. In other words, each cathode electrode of the SPAD sensors $51_1$ to $51_4$ and the input end of the recharge control unit 64 are electrically connected via the terminals $52_1$ to $52_4$ and the comparators $63_1$ to $63_4$, so that the recharge control unit 64 is shared among the four pixels $50_1$ to $50_4$.

The recharge control unit 64 includes a four-input OR circuit 641 and a recharge signal generation circuit 642. The OR circuit 641 obtains the OR of the logic signals retrieved from each cathode electrode of the SPAD sensors $51_1$ to $51_4$ supplied through the comparators $63_1$ to $63_4$. The OR output of the OR circuit 641 is supplied to the recharge signal generation circuit 642. The recharge signal generation circuit 642 generates the recharge signal RCHG by delaying the OR output of the OR circuit 641 by a predetermined delay time, and supplies the recharge signal RCHG to the first switch units $61_1$ to $61_4$. As a result, the recharge control unit 64 performs the recharge control in response to the OR signal of the logic signal whose logic is inverted at the time when photons are incident on one or more of the SPAD sensors $51_1$ to $51_4$.

Figure 6:
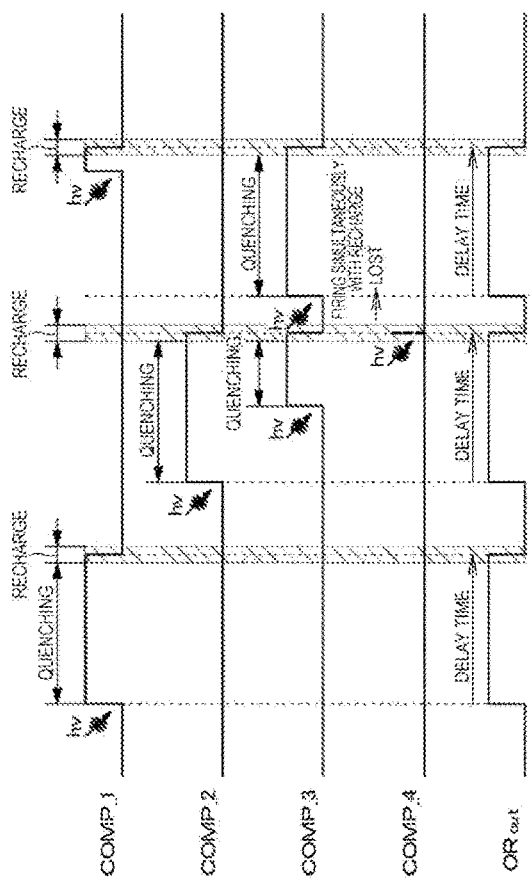
FIG. 6 is a timing waveform diagram for explaining circuit operation of the light receiving device according to the first embodiment.

The circuit operation of the light receiving device 30 according to the first embodiment will be described with reference to the timing waveform diagram of FIG. 6. FIG. 6 shows timing relationships of comparison outputs COMP_1 to COMP_4 of the comparators $63_1$ to $63_4$ for each of the SPAD sensors $51_1$ to $51_4$ and the OR output $OR_{out}$ of the OR circuit 641. Quenching based on the quench signal QNCH and recharging based on the recharge signal RCHG are as described in FIG. 4B. In the timing waveform diagram of FIG. 6, the delay time is the delay time of the recharge signal generation circuit 642.

In a case where the recharge control unit 64 is shared among the four pixels $50_1$ to $50_4$, when photons are incident on one or more SPAD sensors among the SPAD sensors $51_1$ to $51_4$ of the four pixels $50_1$ to $50_4$ that share the recharge control unit 64, recharge control is performed for all of the SPAD sensors $51_1$ to $51_4$. In other words, the recharge control is (collectively) performed for the four pixels $50_1$ to $50_4$. In this case, the SPAD sensor on which the photon is not incident may also be recharged. Therefore, when one SPAD sensor that fires earlier and another SPAD sensor fire (simultaneously fire) during the recharging period, in other words, if a photon enters another SPAD sensor at the timing of the recharge of the one SPAD sensor, the photon is lost (for example, in the case of the comparison output COMP_4 of the comparator $63_4$ in FIG. 6).

However, by setting the recharge period as short as possible within a range not hindering the recharging operation, the loss of photons can be reduced. Accordingly, even if recharging is performed collectively for four pixels $50_1$ to $50_4$, there is no problem in circuit operation.

As described above, in the light receiving device 30 according to the first embodiment, each cathode electrode of the SPAD sensors $51_1$ to $51_4$ and the input end of the recharge control unit 64 are electrically connected via the terminals $52_1$ to $52_4$ and the comparators $63_1$ to $63_4$, so that the recharge control unit 64 is shared among four pixels $50_1$ to $50_4$. By this sharing of the recharge control unit 64, since the circuit area of the circuit unit 60 per pixel can be reduced, the aperture ratio can be increased while miniaturizing the pixel 50.

Second Embodiment

Figure 7:
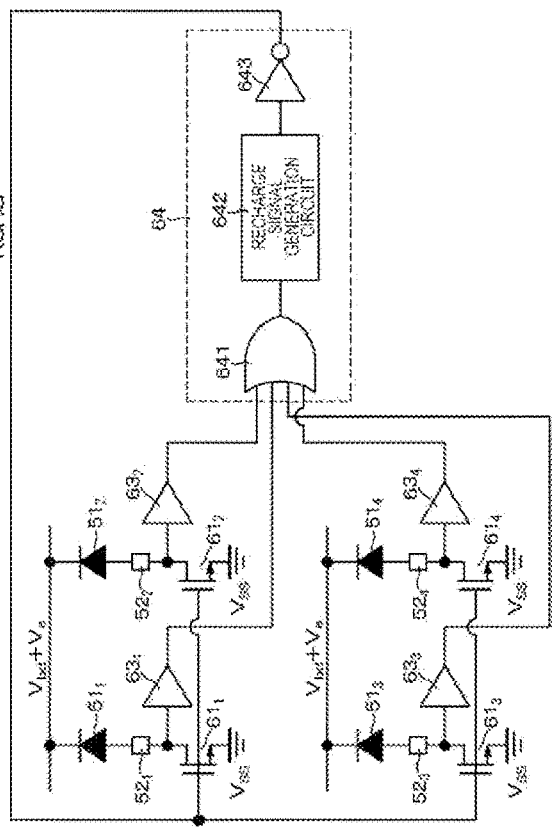
FIG. 7 is a circuit diagram showing a circuit configuration of a light receiving device according to a second embodiment.

A second embodiment is an example of retrieving a signal from an anode electrode side of the SPAD sensor 51. FIG. 7 shows a circuit configuration of the light receiving device 30 according to the second embodiment.

In the pixel $50_1$, the SPAD sensor $51_1$ has a cathode electrode connected to a high potential side power supply and an anode electrode connected to the terminal $52_1$, respectively. The power supply potential of the high potential side power supply is set to $V_{bd}+V_e$. Then, the signal of the SPAD sensor $51_1$ is retrieved through the terminal $52_1$ from the anode electrode side. This is similar in the other SPAD sensors $51_2$ to $51_4$.

A first switch unit $61_1$ serving as a recharge switch is constituted by, for example, an N-channel type field effect transistor, is connected between the terminal $52_1$ and a low-potential $(V_{ss})$ side power supply, and operates according to the recharge signal RCHG provided from the recharge control unit 64. This is similar in the other first switch units $61_2$ to $61_4$.

In addition, the anode electrodes of the SPAD sensors $51_1$ to $51_4$ and the input end of the recharge control unit 64 are electrically connected to each other through the terminals $52_1$ to $52_4$ and the comparators $63_1$ to $63_4$. Due to this connection relationship, the recharge control unit 64 is shared among the four pixels $50_1$ to $50_4$. Note that, the logic of the comparators $63_1$ to $63_4$ is inverted from that in the case of the first embodiment.

The recharge control unit 64 includes the four-input OR circuit 641, the recharge signal generation circuit 642, and an inverter 643. The OR circuit 641 obtains the OR of the logic signals retrieved from each cathode electrode of the SPAD sensors $51_1$ to $51_4$ supplied through the comparators $63_1$ to $63_4$. The OR output of the OR circuit 641 is supplied to the recharge signal generation circuit 642. The recharge signal generation circuit 642 generates the recharge signal RCHG by delaying the OR output of the OR circuit 641 by a predetermined delay time. The inverter 643 inverts the logic of the recharge signal RCHG generated by the recharge signal generation circuit 642 and supplies the logic to the first switch units $61_1$ to $61_4$.

Although the light receiving device 30 according to the second embodiment having the above configuration differs from the light receiving device 30 according to the first embodiment in that the logic of the comparators $63_1$ to $63_4$ and the recharge signal RCHG is inverted, the basic circuit operation is the same.

Third Embodiment

Figure 8:
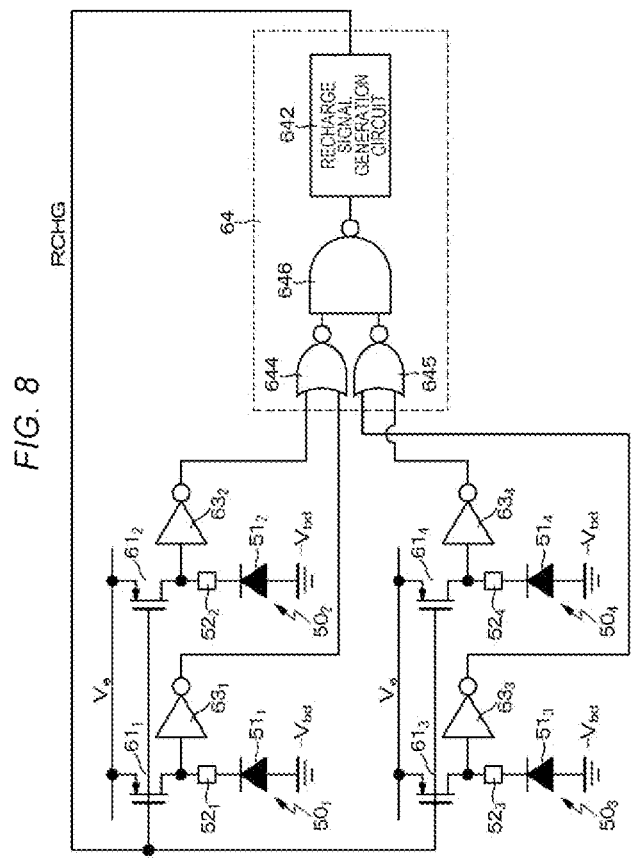
FIG. 8 is a circuit diagram showing a circuit configuration of a light receiving device according to a third embodiment.

A third embodiment is a modification of the first embodiment, and is an example using another circuit configuration as the four-input OR circuit 641. FIG. 8 shows a circuit configuration of the light receiving device 30 according to the third embodiment.

The light receiving device 30 according to the third embodiment has a circuit configuration using two two-input NOR circuits 644, 645 and a two-input NAND circuit 646 instead of the four-input OR circuit 641 of the recharge control unit 64. The NOR circuits 644, 645 and the NAND circuit 646 have the same logic as that of the four-input OR circuit 641, and obtain the OR of the logic signals of the SPAD sensors $51_1$ to $51_4$ supplied through the comparators $63_1$ to $63_4$.

Note that, although the circuit configuration including the two NOR circuits 644, 645 and the NAND circuit 646 has been described as an example of the other circuit configuration of the four-input OR circuit 641, the circuit configuration is not limited to this circuit configuration, and other gate circuit configurations can be adopted as long as the logics are equivalent.

Fourth Embodiment

Figure 9:
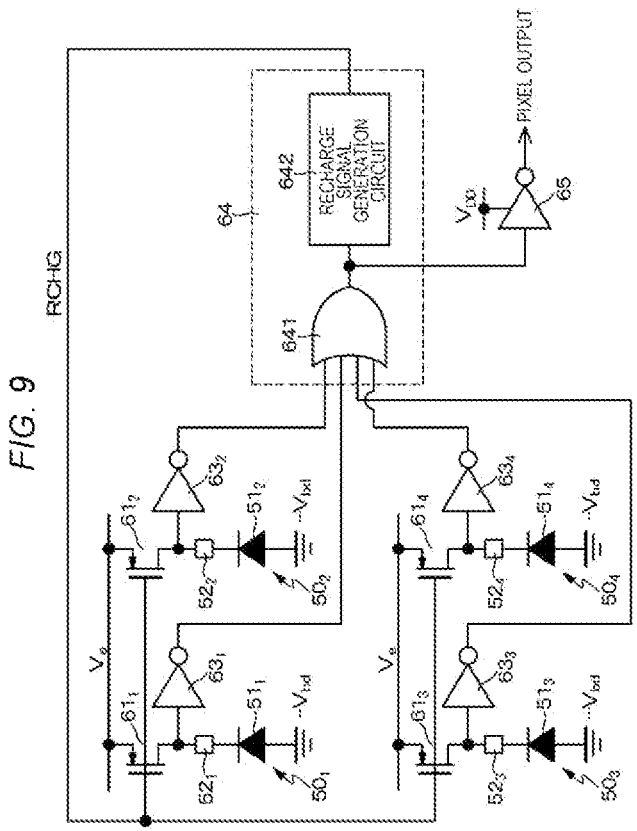
FIG. 9 is a circuit diagram showing a circuit configuration of a light receiving device according to a fourth embodiment.

A fourth embodiment is a modification of the first embodiment, which is a first example of a method of retrieving pixel outputs. FIG. 9 shows a circuit configuration of the light receiving device 30 according to the fourth embodiment.

As is clear from the description in FIG. 3, the pixel output is basically the output of each of the four pixels $50_1$ to $50_4$. In the light receiving device 30 according to the fourth embodiment, the OR output $OR_{out}$ of the four-input OR circuit 641 is retrieved as a pixel output through the level conversion unit 65. The level conversion unit 65 converts the level of the OR output $OR_{out}$ of the four-input OR circuit 641 to the power supply level of the logic circuit 33 at the subsequent stage, and outputs the information as information for detecting the photon incidence timing (pixel output).

The light receiving device 30 according to the fourth embodiment having the above configuration has a circuit configuration in which the level conversion unit 65 and circuits thereafter are also shared among the four pixels $50_1$ to $50_4$. As a result, the circuit area of the circuit unit 60 per pixel can be reduced as compared with the case where the outputs of the four pixels $50_1$ to $50_4$ are derived. From the pixel output, the photon incidence timing to the SPAD sensors $51_1$ to $51_4$ can be detected.

Fifth Embodiment

Figure 10:
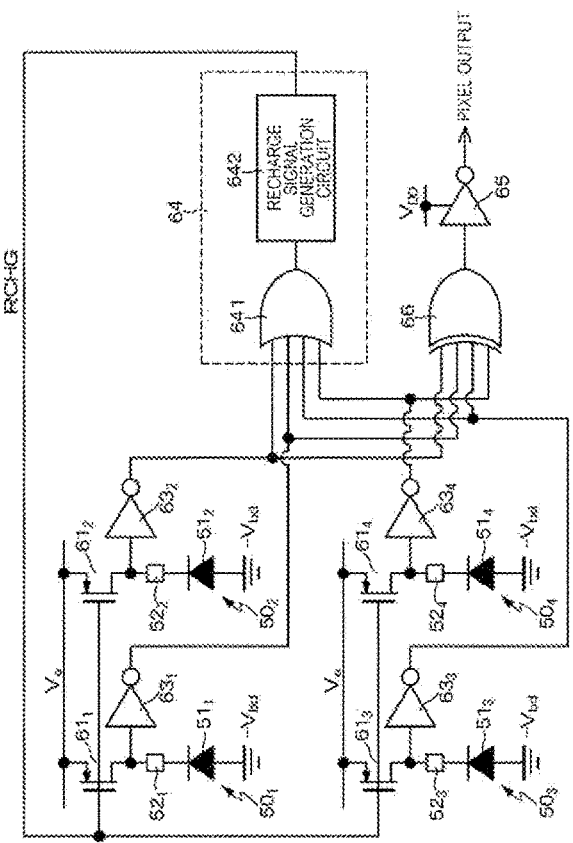
FIG. 10 is a circuit diagram showing a circuit configuration of a light receiving device according to a fifth embodiment.

A fifth embodiment is a modification of the first embodiment, which is a second example of a method of retrieving pixel outputs. FIG. 10 shows a circuit configuration of the light receiving device 30 according to the fifth embodiment.

In the light receiving device 30 according to the fifth embodiment, a four-input EX-OR circuit (exclusive-OR circuit) 66 that obtains the exclusive OR of logic signals whose logic is inverted at the time when photons are incident on one or more of the SPAD sensors $51_1$ to $51_4$ is used. In other words, the EX-OR circuit 66 obtains the exclusive OR of the logic signals of the SPAD sensors $51_1$ to $51_4$ supplied through the comparators $63_1$ to $63_4$. Then, the exclusive logical output $EXOR_{out}$ is retrieved as a pixel output through the level conversion unit 65. The level conversion unit 65 converts the level of the exclusive OR output $OR_{out}$ of the four-input EX-OR circuit 66, and outputs the information as information for detecting the photon incidence timing (pixel output).

Figure 11:
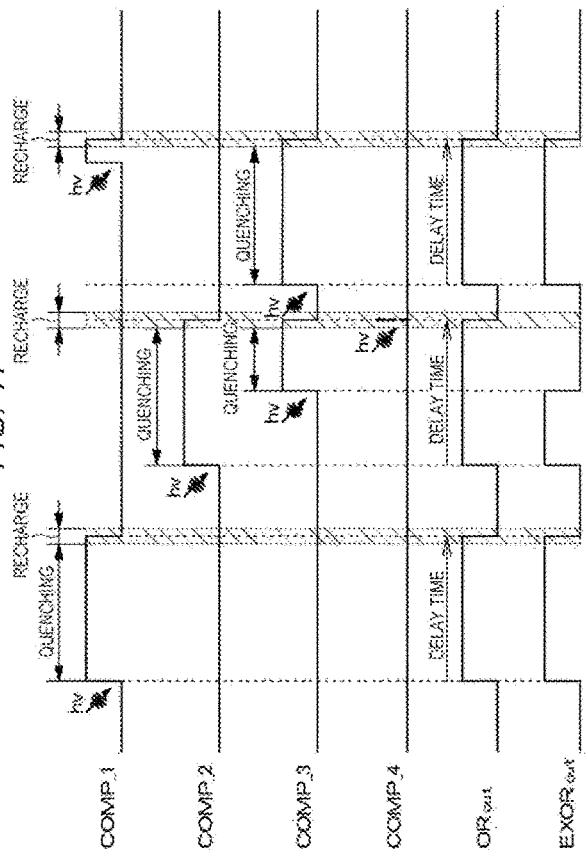
FIG. 11 is a timing waveform diagram for explaining circuit operation of the light receiving device according to the fifth embodiment.

FIG. 11 shows timing relationships among comparison outputs COMP_1 to COMP_4 of the comparators $63_1$ to $63_4$, the OR output $OR_{out}$ of the OR circuit 641, and the exclusive OR output $EXOR_{out}$ of the EX-OR circuit 66. The exclusive OR output $EXOR_{out}$ is used as the pixel output, so that, even if the second SPAD sensor fires before the recharge, the photon incidence timing can be detected.

Sixth Embodiment

A sixth embodiment is a modification of the fourth embodiment, and is an example of detecting the number of incident photons. FIG. 12 shows the circuit configuration of the light receiving device 30 according to the sixth embodiment.

In the light receiving device 30 according to the sixth embodiment, in addition to retrieving information for detecting the incident timing as a pixel output, information for detecting the number of incident photons to the SPAD sensors $51_1$ to $51_4$ is retrieved as a pixel output.

Specifically, the light receiving device 30 according to the sixth embodiment inputs each of the comparison outputs COMP_1 to COMP_4 of the comparators $63_1$ to $63_4$ to the adder 67 through the level conversion units $65_1$ to $65_4$, the number of incident photons is counted by the adder 67, and the addition output $ADD_{out}$ is retrieved as a pixel output (information about the number of incidence).

FIG. 13 shows timing relationships among comparison outputs COMP_1 to COMP_4 of the comparators $63_1$ to $63_4$, the OR output $OR_{out}$ of the OR circuit 641, and the addition output $ADD_{out}$ of the adder 67. By retrieving the addition output $ADD_{out}$ of the adder 67 as the pixel output, it is possible to detect the number of incident photons from the pixel output to the SPAD sensors $51_1$ to $51_4$.

Seventh Embodiment

Figure 14:
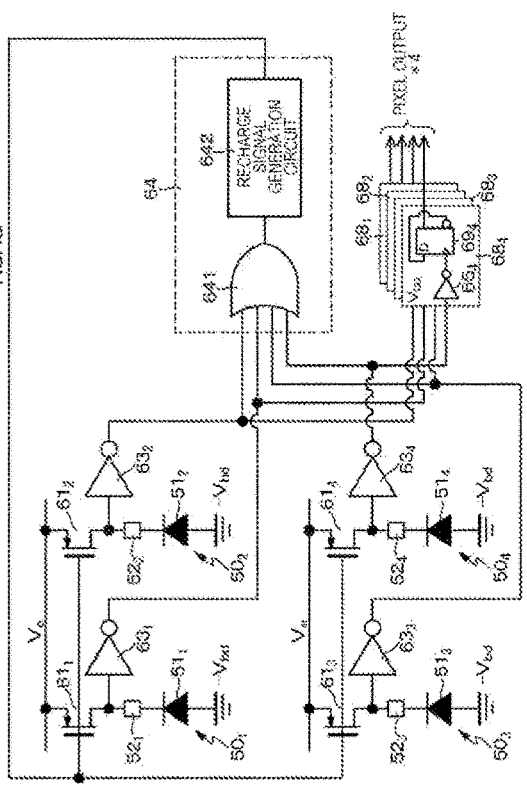
FIG. 14 is a circuit diagram showing a circuit configuration of a light receiving device according to a seventh embodiment.

A seventh embodiment is a modification of the first embodiment, and is an example in which the pixel output is retrieved for each pixel. FIG. 14 shows the circuit configuration of the light receiving device 30 according to the seventh embodiment.

In the light receiving device 30 according to the seventh embodiment, the comparison outputs COMP_1 to COMP_4 of the comparators $63_1$ to $63_4$ are retrieved as pixel outputs for each pixel through waveform shaping units $68_1$ to $68_4$, respectively.

Specifically, the light receiving device 30 according to the seventh embodiment has the waveform shaping units $68_1$ to $68_4$ that performs processing of increasing the pulse width for each of the comparison outputs COMP_1 to COMP_4 (each input signal of the OR circuit 641) of the comparators $63_1$ to $63_4$, and outputs the result. The waveform shaping unit $68_4$ includes a D-type flip-flop $69_4$ in addition to the level conversion unit $65_4$ that level-converts the comparison output COMP_4 of the comparator $63_4$ to the power supply potential $V_{DD}$. This is similar in the other waveform shaping units $68_1$ to $68_3$.

Figure 15:
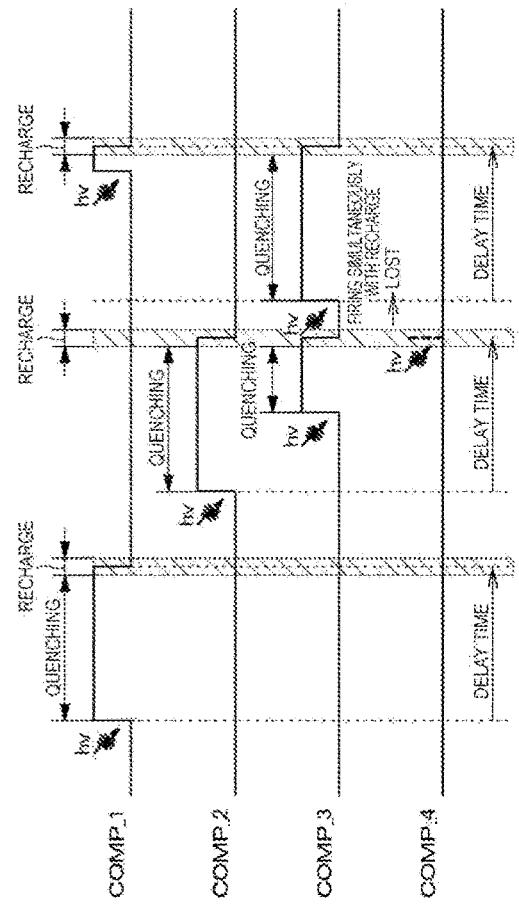
FIG. 15 is a timing waveform diagram for explaining circuit operation of the light receiving device according to the seventh embodiment.

The D-type flip-flop $69_4$ performs toggle operation in which the logic of the output is inverted each time an input is applied. As a result of this toggle operation, the D-type flip-flop $69_4$ shapes the waveform of the comparison output COMP_4 into a pulse signal having a pulse width wider than the comparison output COMP_4 and makes the result a pixel output. This is similar in the other D type flip-flops $69_1$ to $69_3$. FIG. 15 shows the timing relationship of the comparison outputs COMP_1 to COMP_4 of the comparators $63_1$ to $63_4$. Each of the comparison outputs COMP_1 to COMP_4 becomes a pixel output through the waveform shaping units $68_1$ to $68_4$.

Eighth Embodiment

An eighth embodiment is an example of the chip structure of the light receiving device 30. As the chip structure of the light receiving device 30, a stacked structure and a flat structure can be exemplified.
(Stacked Structure)

Figure 16:
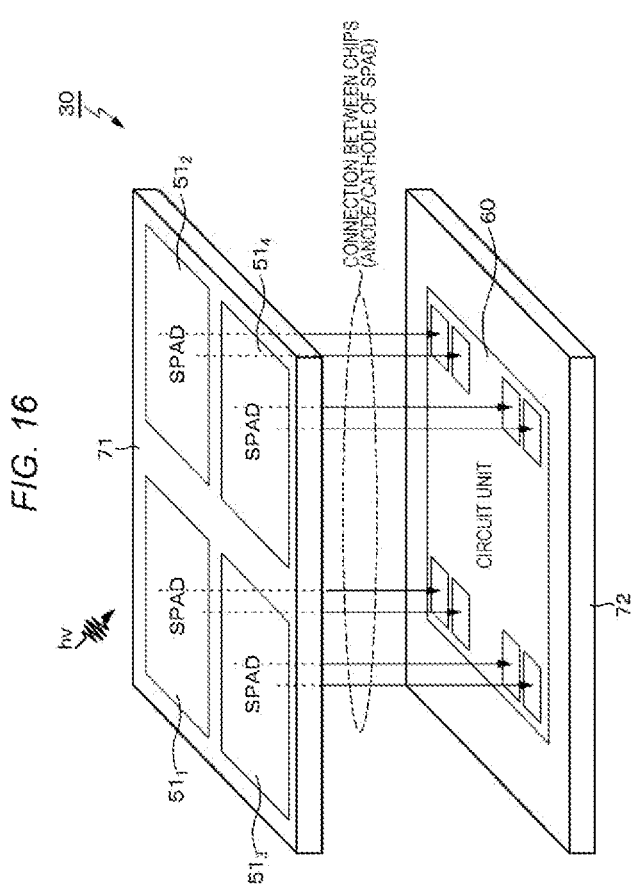
FIG. 16 is an exploded perspective view showing an example of a stacked structure of a light receiving device according to an eighth embodiment.

FIG. 16 shows an exploded perspective view of a stacked structure of the light receiving device 30 according to the eighth embodiment. Here, in order to facilitate understanding, a case where the number of pixels sharing the recharge control unit 64 is four, in other words, the SPAD sensors $51_1$ to $51_4$ having four pixels of two columns×two rows, and the circuit unit 60 including the shared recharge control unit 64 are shown.

The SPAD sensors $51_1$ to $51_4$ are arranged in a two-dimensional array on the sensor chip 71 including the first semiconductor substrate. The circuit unit 60 corresponding to the SPAD sensors $51_1$ to $51_4$ is formed on the circuit chip 72 including the second semiconductor substrate stacked on the sensor chip 71.

The circuit unit 60 includes the first switch unit 61 ($61_1$ to $61_4$) as a recharge switch, the second switch unit 62 as a quench switch, and the comparator 63 ($63_1$ to $63_4$) that are provided for each SPAD sensor $51_1$ to $51_4$, the recharge control unit 64 shared among the four pixels, and the like.

According to the stacked structure in which the sensor chip 71 and the circuit chip 72 are stacked of the above configuration, the recharge control unit 64 is shared among a plurality of pixels, so that the circuit area of the circuit unit 60 per pixel can be reduced, and thereby, the pixel 50 can be miniaturized, and further, the size of the chip size can be reduced.

Note that, in this example, the two-layer structure of the first-layer sensor chip 71 and the second-layer circuit chip 72 is described as an example of the stacked structure. However, the technology of the present disclosure is not limited to the two-layer structure, and three or more layered structure may be adopted.
(Flat Structure)

Figure 17:
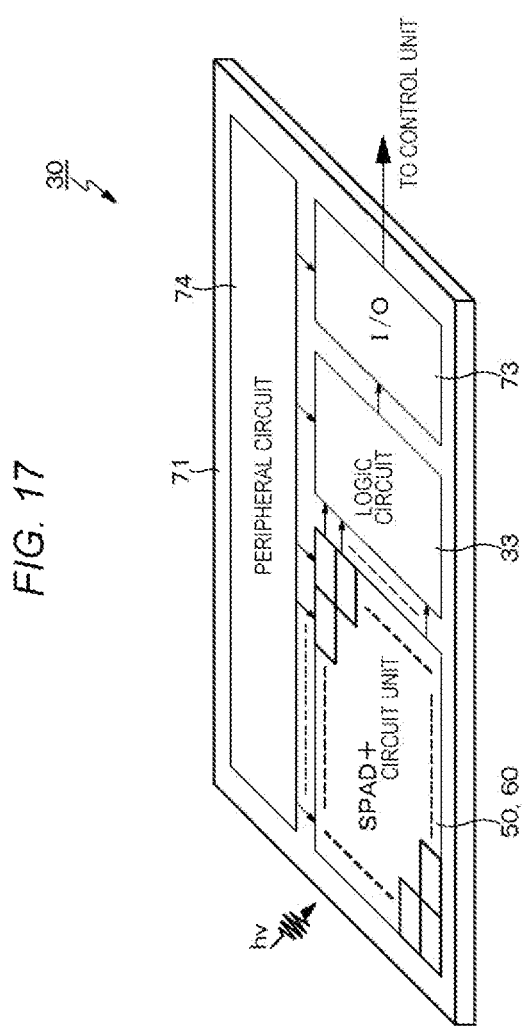
FIG. 17 is a perspective view showing an example of a flat structure of the light receiving device according to the eighth embodiment.

The technology of the present disclosure is not limited to the application to a chip structure having a stacked structure, and can also be applied to a chip structure having a flat structure. FIG. 17 shows a perspective view of a flat structure of the light receiving device 30 according to the eighth embodiment.

In the flat structure according to this example, on the same substrate as the sensor chip 71 in which the SPAD sensors $51_1$ to $51_4$ are arranged in a two-dimensional array, the circuit unit 60 including the first switch unit 61, the second switch unit 62, the comparator 63, the recharge control unit 64 shared by four pixels, and the like, the logic circuit 33, an I/O 73, and a peripheral circuit 74 are integrated.

Also in the case of the flat structure of the above configuration, the recharge control unit 64 is shared among the plurality of pixels, so that, since the circuit area of the circuit unit 60 per pixel can be reduced, the aperture ratio can be increased while miniaturizing the pixel 50.

Ninth Embodiment

Figure 18:
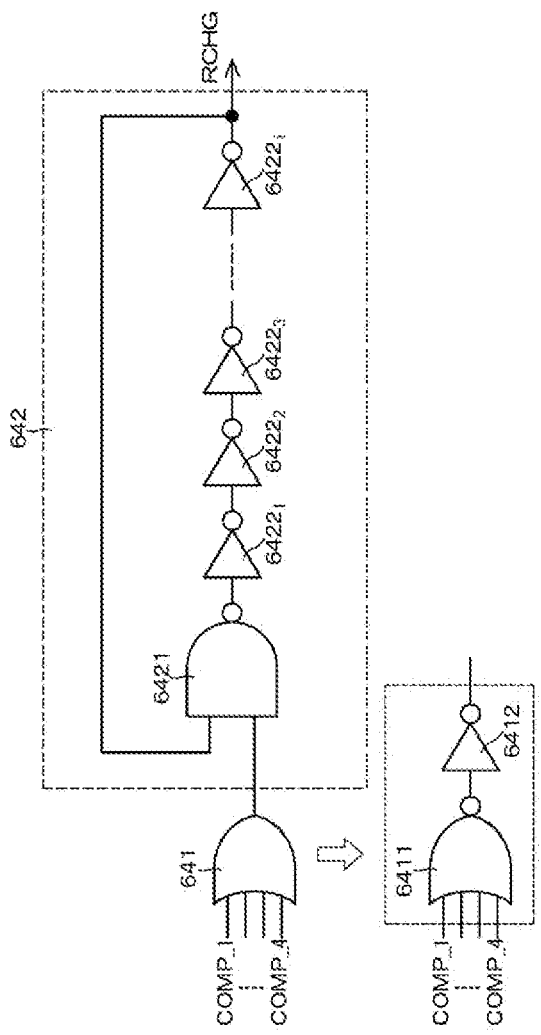
FIG. 18 is a circuit diagram showing an example of a circuit configuration of a recharge signal generation circuit according to a ninth embodiment.

A ninth embodiment is a first example in which the recharge signal generation circuit 642 of the recharge control unit 64 includes a ring oscillator. FIG. 18 shows a circuit configuration of the recharge signal generation circuit 642 according to the ninth embodiment.

The recharge signal generation circuit 642 according to the ninth embodiment includes a ring oscillator that oscillates by the connection in a ring shape of a two-input NAND circuit 6421 and a plurality of asymmetric delay elements $6422_1$ to $6422_i$. Here, the asymmetric delay element is a delay element in which the rising delay time $td_{\_rise\_DLY}$ and the falling delay time $td_{\_fall\_DLY}$ are different. An example of an asymmetric delay element is an inverter. In the input stage NAND circuit 6421, the OR output $OR_{out}$ of the OR circuit 641 is used as one input and the output of the last stage asymmetric delay element $6422_i$ as the recharge signal RCHG is used as the other input.

Figure 19:
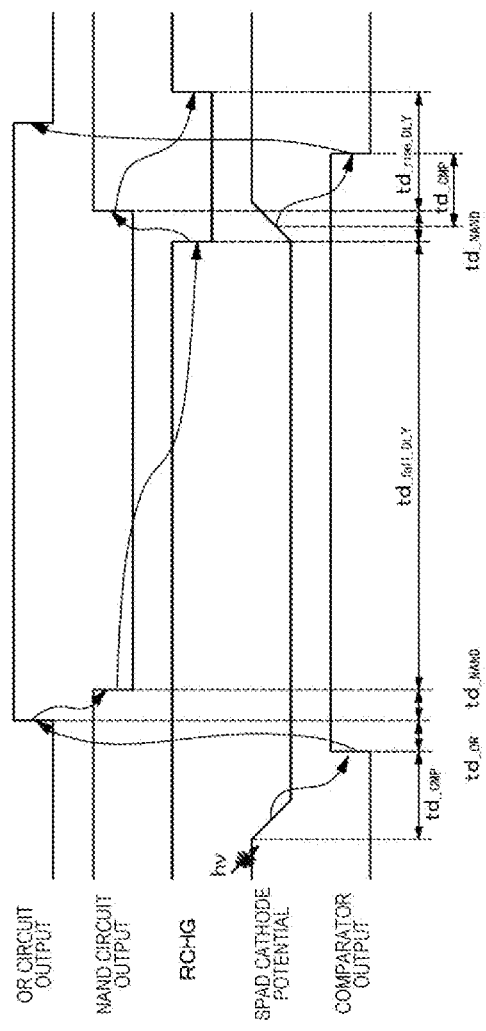
FIG. 19 is a timing waveform diagram for explaining circuit operation of the light receiving device having the recharge signal generation circuit according to the ninth embodiment.

FIG. 19 shows a timing waveform diagram of each unit in the light receiving device 30 having the recharge signal generation circuit 642 of the above configuration. FIG. 19 shows the timing waveforms of the output of the OR circuit 641, the output of the NAND circuit 6421, the recharge signal RCHG, the cathode potential of the SPAD sensor 51 ($51_1$ to $51_4$), and the output of the comparator 63 ($63_1$ to $63_4$).

Using the ring oscillator having the above configuration as the recharge signal generation circuit 642 is preferable since a fine pulse width can be arbitrarily set for the recharge signal RCHG by adjusting the number of stages of the asymmetric delay elements $6422_1$ to $6422_i$. Note that, as shown in FIG. 18, the four-input OR circuit 641 may have a circuit configuration including a combination of a four-input NOR circuit 6411 and an inverter 6412.

Tenth Embodiment

Figure 20:
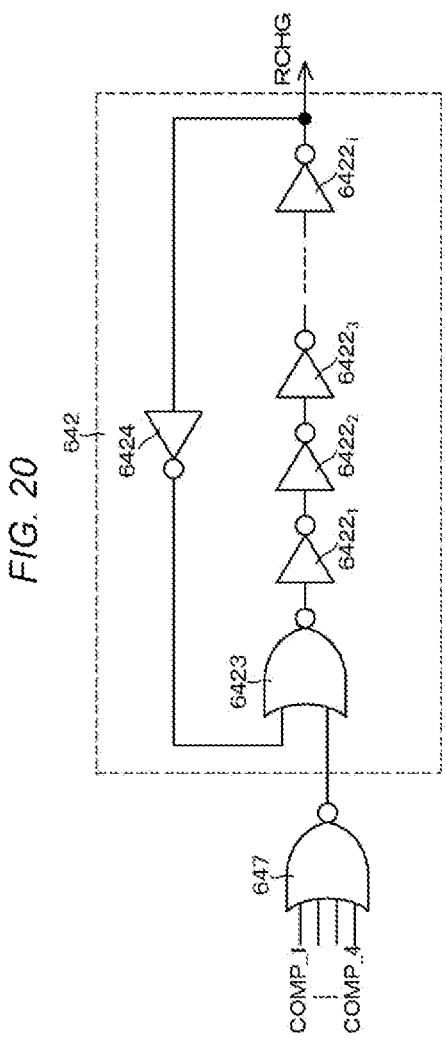
FIG. 20 is a circuit diagram showing an example of a circuit configuration of a recharge signal generation circuit according to a tenth embodiment.

A tenth embodiment is a second example in which the recharge signal generation circuit 642 of the recharge control unit 64 includes a ring oscillator. FIG. 20 shows a circuit configuration of the recharge signal generation circuit 642 according to the tenth embodiment.

The recharge signal generation circuit 642 according to the ninth embodiment includes the two-input NAND circuit 6421 and the plurality of asymmetric delay elements $6422_1$ to $6422_i$. On the other hand, the recharge signal generation circuit 642 according to the tenth embodiment uses a two-input NOR circuit 6423 instead of the two-input NAND circuit 6421.

In using the two-input NOR circuit 6423, the inverter 6424 is inserted in the path between the output end of the last stage asymmetric delay element $6422_i$ and the other input end of the NOR circuit 6423. Furthermore, the four-input NOR circuit 647 is used in place of the four-input OR circuit 641 that takes the OR of the comparison outputs COMP_1 to COMP_4 of the comparators $63_1$ to $63_4$. Thus, the recharge signal generation circuit 642 according to the tenth embodiment is a circuit having equivalent logic to the logic of the recharge signal generation circuit 642 according to the ninth embodiment.

Eleventh Embodiment

Figure 21:
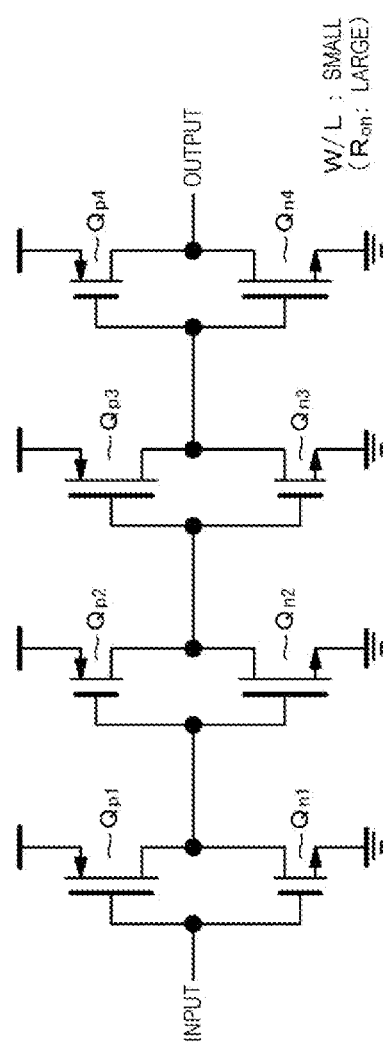
FIG. 21 is a circuit diagram showing an example of a circuit configuration of an asymmetric delay element according to an eleventh embodiment.

An eleventh embodiment is an example of an asymmetric delay element constituting the ring oscillator. FIG. 21 is a circuit configuration of an asymmetric delay element according to the eleventh embodiment. Here, the asymmetric delay element is exemplified as a four-stage configuration. However, the configuration is not limited thereto. This is similar in a twelfth embodiment and a thirteenth embodiment to be described later.

In the asymmetric delay element according to the eleventh embodiment, the first stage has a CMOS inverter configuration including a P-channel field effect transistor $Q_{p1}$ and an N-channel field effect transistor $Q_{n1}$ connected in series between the high potential side power supply and the low potential side power supply. Specifically, gate electrodes of the P-channel field effect transistor $Q_{p1}$ and the N-channel field effect transistor $Q_{n1}$ are connected in common to serve as input ends, and the drain electrodes are connected in common to serve as output ends.

Then, the transistor sizes of the P-channel field effect transistor $Q_{p1}$ and the N-channel field effect transistor $Q_{n1}$ are asymmetric. Specifically, if a channel width is W and a channel length is L, a transistor size W/L is set so that the P-channel field effect transistor $Q_{p1}$ is smaller than the N-channel field effect transistor $Q_{n1}$. If the transistor size W/L is small, the on-resistance $R_{on}$ is large, and if the transistor size W/L is large, the on-resistance $R_{on}$ is small.

The second stage has a CMOS inverter configuration including a P-channel field effect transistor $Q_{p2}$ and an N-channel field effect transistor $Q_{n2}$ connected between the high potential side power supply and the low potential side power supply. In addition, the transistor size W/L is set so that the P-channel field effect transistor $Q_{p2}$ is larger than the N-channel field effect transistor $Q_{n2}$.

The third stage has a CMOS inverter configuration including a P-channel field effect transistor $Q_{p3}$ and an N-channel field effect transistor $Q_{n3}$. In addition, regarding the transistor size W/L, the setting is similar to that of the first stage CMOS inverter. The fourth stage has a CMOS inverter configuration including a P-channel field effect transistor $Q_{p4}$ and an N-channel field effect transistor $Q_{n4}$. In addition, regarding the transistor size W/L, the setting is similar to that of the second stage CMOS inverter.

In the asymmetric delay element according to the eleventh embodiment having the above configuration, when the input signal transits from the high level to the low level, the transistor with the higher on-resistance $R_{on}$ drives the next stage, so that the delay time becomes long. Conversely, when the input signal transits from the low level to the high level, the transistor with the smaller on-resistance $R_{on}$ drives the next stage, so that the delay time becomes short. Accordingly, the rising delay time $td\_{rise\_DLY}$ and the falling delay time $td\_{fall\_DLY}$ are different.

Twelfth Embodiment

Figure 22:
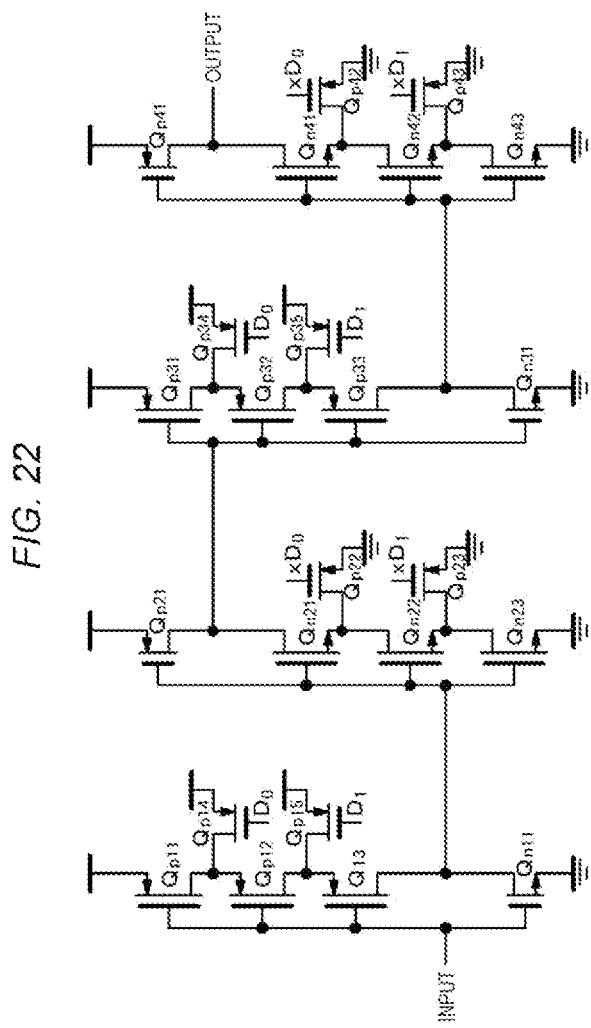
FIG. 22 is a circuit diagram showing an example of a circuit configuration of an asymmetric delay element according to a twelfth embodiment.

A twelfth embodiment is a modification of the eleventh embodiment, and is an example of switching the number of series (the number of series connections) of elements with high on-resistance constituting the CMOS inverter. FIG. 22 is a circuit configuration of the asymmetric delay element according to the twelfth embodiment.

In the asymmetric delay element according to the twelfth embodiment, the first stage has a CMOS inverter configuration including, for example, three P-channel field effect transistors $Q_{p11}$, $Q_{p12}$, and $Q_{p13}$ and an N-channel field effect transistor $Q_{n11}$ connected in series between the high potential side power supply and the low potential side power supply.

Specifically, gate electrodes of the P-channel field effect transistors $Q_{p11}$, $Q_{p12}$, and $Q_{p13}$ and the N-channel field effect transistor $Q_{n11}$ are connected in common to serve as input ends, and the drain electrodes of the field effect transistor $Q_{p13}$ and the field effect transistor $Q_{n11}$ are connected in common to serve as output ends.

In the first stage CMOS inverter of the above configuration, the P-channel field effect transistors $Q_{p11}$, $Q_{p12}$, and $Q_{p13}$ have higher on-resistance than the N-channel field effect transistor $Q_{n11}$. Furthermore, for example, the sizes W/L of the P-channel field effect transistors $Q_{p11}$, $Q_{p12}$, and $Q_{p13}$ are set to be equal.

Furthermore, the P-channel field effect transistor $Q_{p14}$ is connected between the common connection node of the field effect transistor $Q_{p11}$ and the field effect transistor $Q_{p12}$ and the high potential side power supply. Moreover, the P-channel field effect transistor $Q_{p15}$ is connected between the common connection node of the field effect transistor $Q_{p12}$ and the field effect transistor $Q_{p13}$ and the high potential side power supply. A control signal $D_0$ is applied to the gate electrode of the P-channel field effect transistor $Q_{p14}$, and a control signal $D_1$ is applied to the gate electrode of the P-channel field effect transistor $Q_{p15}$.

Then, in accordance with the logic of the control signals $D_0$, $D_1$, the number of series connections of the P-channel field effect transistors $Q_{p11}$, $Q_{p12}$, and $Q_{p13}$ is changed. Specifically, when the control signals $D_0$, $D_1$ are both logic 0, both the field effect transistors $Q_{p14}$, $Q_{p15}$ are rendered conductive, so that only the field effect transistor $Q_{p13}$ is connected in series to the N-channel field effect transistor $Q_{n11}$.

When the control signal $D_0$ is logic 0 and the control signal $D_1$ is logic 1, the field effect transistor $Q_{p14}$ is rendered conductive, and the field effect transistor $Q_{p15}$ is rendered non-conductive, so that the field effect transistors $Q_{p12}$, $Q_{p13}$ are connected in series to the N-channel field effect transistor $Q_{n11}$. When the control signals $D_0$, $D_1$ are both logic 1, both the field effect transistors $Q_{p14}$, $Q_{p15}$ are rendered non-conductive, so that the field effect transistors $Q_{p11}$, $Q_{p12}$, and $Q_{p13}$ are connected in series to the N-channel field effect transistor $Q_{n11}$.

The second stage has a CMOS inverter configuration including a P-channel field effect transistor $Q_{p21}$ and, for example, three N-channel field effect transistors $Q_{n21}$, $Q_{n22}$, and $Q_{n23}$ connected in series between the high potential side power supply and the low potential side power supply. Specifically, gate electrodes of the P-channel field effect transistor $Q_{p21}$ and the N-channel field effect transistors $Q_{n21}$, $Q_{n22}$, and $Q_{n23}$ are connected in common to serve as input ends, and the drain electrodes of the field effect transistor $Q_{p21}$ and the field effect transistor $Q_{n21}$ are connected in common to serve as output ends.

In the second stage CMOS inverter of the above configuration, the N-channel field effect transistors $Q_{n21}$, $Q_{n22}$, and $Q_{n23}$ have higher on-resistance than the P-channel field effect transistor $Q_{p21}$. Furthermore, for example, the sizes W/L of the N-channel field effect transistors $Q_{n21}$, $Q_{n22}$, and $Q_{n23}$ are set to be equal.

Furthermore, the P-channel field effect transistor $Q_{p22}$ is connected between the common connection node of the field effect transistor $Q_{n21}$ and the field effect transistor $Q_{n22}$, and the low potential side power supply. Moreover, the P-channel field effect transistor $Q_{p23}$ is connected between the common connection node of the field effect transistor $Q_{n22}$ and the field effect transistor $Q_{n23}$ and the low potential side power supply. An inverted signal $xD_0$ of the control signal $D_0$ is applied to the gate electrode of the P-channel field effect transistor $Q_{p22}$, and an inverted signal $xD_1$ of the control signal $D_1$ is applied to the gate electrode of the P-channel field effect transistor $Q_{p23}$.

Then, in accordance with the logic of the control signals (inverted signals) $xD_0$, $xD_1$, the number of series connections of the N-channel field effect transistors $Q_{n21}$, $Q_{n22}$, $Q_{n23}$ is changed. Specifically, when the control signals $xD_0$, $xD_1$ are both logic 0, both the field effect transistors $Q_{p22}$, $Q_{p23}$ are rendered conductive, so that only the field effect transistor $Q_{n21}$ is connected in series to the P-channel field effect transistor $Q_{p21}$.

When the control signals $xD_0$ is logic 1 and the control signal $xD_1$ is logic 0, the field effect transistor $Q_{p22}$ is rendered non-conductive, and the field effect transistor $Q_{p23}$ is rendered conductive, so that the field effect transistors $Q_{n21}$, $Q_{n22}$ are connected in series to the P-channel field effect transistor $Q_{p21}$. When the control signals $D_0$, $D_1$ are both logic 1, both the field effect transistors $Q_{p22}$, $Q_{p23}$ are rendered non-conductive, so that the field effect transistors $Q_{n21}$, $Q_{n22}$, $Q_{n23}$ are connected in series to the P-channel field effect transistor $Q_{p21}$.

The third stage has a CMOS inverter configuration including, for example, three P-channel field effect transistors $Q_{p31}$, $Q_{p32}$, and $Q_{p33}$ and, the N-channel field effect transistor $Q_{n31}$ connected in series between the high potential side power supply and the low potential side power supply. Specifically, gate electrodes of the P-channel field effect transistors $Q_{p31}$, $Q_{p32}$, and $Q_{p33}$ and the N-channel field effect transistor $Q_{n31}$ are connected in common to serve as input ends, and the drain electrodes of the field effect transistor $Q_{p33}$ and the field effect transistor $Q_{n31}$ are connected in common to serve as output ends.

In the third stage CMOS inverter of the above configuration, the P-channel field effect transistors $Q_{p31}$, $Q_{p32}$, $Q_{p33}$ have higher on-resistance than the N-channel field effect transistor $Q_{n31}$. Furthermore, for example, the sizes W/L of the P-channel field effect transistors $Q_{p31}$, $Q_{p32}$, and $Q_{p33}$ are set to be equal.

Furthermore, the P-channel field effect transistor $Q_{p34}$ is connected between the common connection node of the field effect transistor $Q_{p31}$ and the field effect transistor $Q_{p32}$ and the high potential side power supply. Moreover, the P-channel field effect transistor $Q_{p15}$ is connected between the common connection node of the field effect transistor $Q_{p32}$ and the field effect transistor $Q_{p33}$ and the high potential side power supply. A control signal $D_0$ is applied to the gate electrode of the P-channel field effect transistor $Q_{p34}$, and a control signal $D_1$ is applied to the gate electrode of the P-channel field effect transistor $Q_{p15}$. The circuit operation according to the logic of the control signals $D_0$, $D_1$ is the same as that in the case of the first stage CMOS inverter.

The fourth stage has a CMOS inverter configuration including a P-channel field effect transistor $Q_{p41}$ and, for example, three N-channel field effect transistors $Q_{n41}$, $Q_{n42}$, and $Q_{n43}$ connected in series between the high potential side power supply and the low potential side power supply. Specifically, gate electrodes of the P-channel field effect transistor $Q_{p41}$ and the N-channel field effect transistors $Q_{n41}$, $Q_{n42}$, and $Q_{n43}$ are connected in common to serve as input ends, and the drain electrodes of the field effect transistor $Q_{p41}$ and the field effect transistor $Q_{n41}$ are connected in common to serve as output ends.

In the fourth stage CMOS inverter of the above configuration, the N-channel field effect transistors $Q_{n41}$, $Q_{n42}$, and $Q_{n43}$ have higher on-resistance than the P-channel field effect transistor $Q_{p41}$. Furthermore, for example, the sizes W/L of the N-channel field effect transistors $Q_{p41}$, $Q_{p42}$, and $Q_{p43}$ are set to be equal.

Furthermore, the P-channel field effect transistor $Q_{p42}$ is connected between the common connection node of the field effect transistor $Q_{n41}$ and the field effect transistor $Q_{p42}$ and the low potential side power supply. Moreover, the P-channel field effect transistor $Q_{p43}$ is connected between the common connection node of the field effect transistor $Q_{p42}$ and the field effect transistor $Q_{n43}$ and the low potential side power supply. An inverted signal $xD_0$ of the control signal $D_0$ is applied to the gate electrode of the P-channel field effect transistor $Q_{p42}$, and an inverted signal $xD_1$ of the control signal $D_1$ is applied to the gate electrode of the P-channel field effect transistor $Q_{p43}$. The circuit operation according to the logic of the control signals (inverted signals) $xD_0$, $xD_1$ is the same as that in the case of the second stage CMOS inverter.

As described above, in the asymmetric delay element according to the twelfth embodiment, the number of series connections of the field effect transistors having high on-resistance constituting the CMOS inverter is changed according to the logic of the control signals $D_0$, $D_1$. Specifically, in the CMOS inverters of the first and the third stages, the number of series connections of the P-channel field effect transistors is changed, and in the CMOS inverters of the second and fourth stages, the number of series connections of the N-channel field effect transistors is changed. FIG. 23A shows a truth table of the asymmetric delay element according to the twelfth embodiment.

The number of series connections of the field effect transistors having high on-resistance constituting the CMOS inverter is changed according to the logic of the control signals $D_0$, $D_1$, so that the delay time can be controlled. In the truth table of FIG. 23A, if the delay time when the control signals $D_0$, $D_1$ are both logic 0 is $td_0$, the delay time when the control signal $D_0$ is logic 0 and the control signal $D_1$ is logic 1 is $td_1$, and the delay time when the control signals $D_0$, $D_1$ are both logic 1 is $td_2$, the magnitude relation $td_0 < td_1 < td_2$ is satisfied.

Thirteenth Embodiment

Figure 24:
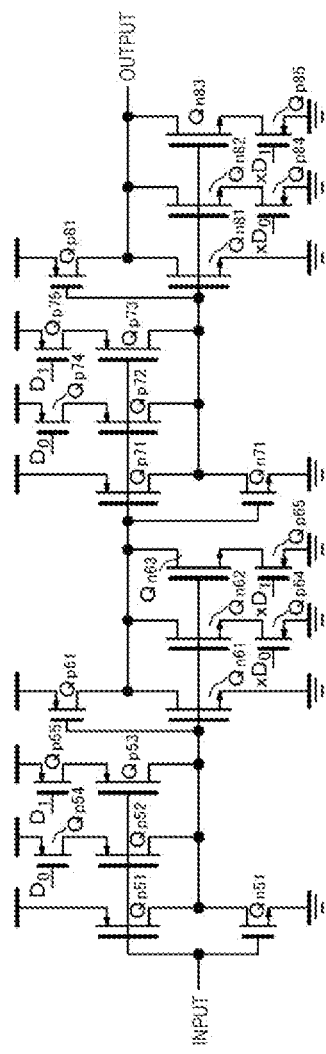
FIG. 24 is a circuit diagram showing an example of a circuit configuration of an asymmetric delay element according to a thirteenth embodiment.

A thirteenth embodiment is a modification of the eleventh embodiment, and is an example of switching the number of parallel (the number of parallel connections) of elements with high on-resistance constituting the CMOS inverter. FIG. 24 shows a circuit configuration of the asymmetric delay element according to the thirteenth embodiment.

In the asymmetric delay element according to the thirteenth embodiment, in the first stage having a CMOS inverter including a P-channel field effect transistor $Q_{p51}$ and an N-channel field effect transistor $Q_{n51}$ connected in series between the high potential side power supply and the low potential side power supply, the P-channel field effect transistor $Q_{p51}$ has higher on-resistance than that of the N-channel field effect transistor $Q_{n51}$. Then, for example, three P-channel field effect transistors having a high on-resistance, in other words, the field effect transistors $Q_{p51}$, $Q_{p52}$, and $Q_{p53}$ are connected in parallel.

Furthermore, the P-channel field effect transistor $Q_{p54}$ is connected between the P-channel field effect transistor $Q_{p52}$ and the high potential side power supply, and the P-channel field effect transistor $Q_{p55}$ is connected between the P-channel field effect transistor $Q_{p53}$ and the high potential side power supply. A control signal $D_0$ is applied to the gate electrode of the P-channel field effect transistor $Q_{p54}$, and a control signal $D_1$ is applied to the gate electrode of the P-channel field effect transistor $Q_{p55}$.

Then, in accordance with the logic of the control signals $D_0$, $D_1$, the number of parallel connections of the P-channel field effect transistors $Q_{p51}$, $Q_{p52}$, and $Q_{p53}$ is changed. Specifically, when the control signals $D_0$, $D_1$ are both logic 0, both the field effect transistors $Q_{p54}$, $Q_{p55}$ are rendered conductive, so that the field effect transistor $Q_{p52}$ and the field effect transistor $Q_{p53}$ are connected in parallel to the field effect transistor $Q_{p51}$.

When the control signal $D_0$ is logic 0 and the control signal $D_1$ is logic 1, the field effect transistor $Q_{p54}$ is rendered conductive, and the field effect transistor $Q_{p55}$ is rendered non-conductive, so that the field effect transistor $Q_{p52}$ is connected in parallel to the field effect transistor $Q_{p51}$. When the control signals $D_0$, $D_1$ are both logic 1, both the field effect transistors $Q_{p54}$, $Q_{p55}$ are rendered non-conductive, so that the field effect transistor $Q_{p51}$ is independently connected in series to the N-channel field effect transistor $Q_{n51}$.

In the second stage having a CMOS inverter including a P-channel field effect transistor $Q_{p61}$ and an N-channel field effect transistor $Q_{n61}$ connected in series between the high potential side power supply and the low potential side power supply, the N-channel field effect transistor $Q_{n61}$ has higher on-resistance than that of the P-channel field effect transistor $Q_{p61}$. Then, for example, three N-channel field effect transistors having a high on-resistance, in other words, the field effect transistors $Q_{n61}$, $Q_{n62}$, and $Q_{n63}$ are connected in parallel.

Furthermore, the P-channel field effect transistor $Q_{p64}$ is connected between the N-channel field effect transistor $Q_{n62}$ and the low potential side power supply, and the P-channel field effect transistor $Q_{p65}$ is connected between the N-channel field effect transistor $Q_{n63}$ and the low potential side power supply. An inverted signal $xD_0$ of the control signal $D_0$ is applied to the gate electrode of the P-channel field effect transistor $Q_{p64}$, and an inverted signal $xD_1$ of the control signal $D_1$ is applied to the gate electrode of the P-channel field effect transistor $Q_{p65}$.

Then, in accordance with the logic of the control signals (inverted signals) $xD_0$, $xD_1$, the number of parallel connections of the N-channel field effect transistors $Q_{n61}$, $Q_{n62}$, and $Q_{n63}$ is changed. Specifically, when the control signals $D_0$, $D_1$ are both logic 0, both the field effect transistors $Q_{p64}$, $Q_{p65}$ are rendered conductive, so that the field effect transistor $Q_{n62}$ and the field effect transistor $Q_{n63}$ are connected in parallel to the field effect transistor $Q_{n61}$.

When the control signals $xD_0$ is logic 0 and the control signal $xD_1$ is logic 1, the field effect transistor $Q_{p64}$ is rendered conductive, and the field effect transistor $Q_{p65}$ is rendered non-conductive, so that the field effect transistor $Q_{n62}$ is connected in parallel to the field effect transistor $Q_{n61}$. When the control signals $xD_0$, $xD_1$ are both logic 1, both the field effect transistors $Q_{p64}$, $Q_{p65}$ are rendered non-conductive, so that the field effect transistor $Q_{n61}$ is independently connected in series to the P-channel field effect transistor $Q_{p61}$.

In the third stage having a CMOS inverter including a P-channel field effect transistor $Q_{p71}$ and an N-channel field effect transistor $Q_{n71}$ connected in series between the high potential side power supply and the low potential side power supply, the P-channel field effect transistor $Q_{p71}$ has higher on-resistance than that of the N-channel field effect transistor $Q_{n71}$. Then, for example, three P-channel field effect transistors having a high on-resistance, in other words, the field effect transistors $Q_{p71}$, $Q_{p72}$, and $Q_{p73}$ are connected in parallel.

Furthermore, the P-channel field effect transistor $Q_{p74}$ is connected between the P-channel field effect transistor $Q_{p72}$ and the high potential side power supply, and the P-channel field effect transistor $Q_{p75}$ is connected between the P-channel field effect transistor $Q_{p73}$ and the high potential side power supply. A control signal $D_0$ is applied to the gate electrode of the P-channel field effect transistor $Q_{p74}$, and a control signal $D_1$ is applied to the gate electrode of the P-channel field effect transistor $Q_{p75}$. The circuit operation according to the logic of the control signals $D_0$, $D_1$ is the same as that in the case of the first stage CMOS inverter.

In the fourth stage having a CMOS inverter including a P-channel field effect transistor $Q_{p81}$ and an N-channel field effect transistor $Q_{n81}$ connected in series between the high potential side power supply and the low potential side power supply, the N-channel field effect transistor $Q_{n81}$ has higher on-resistance than that of the P-channel field effect transistor $Q_{p81}$. Then, for example, three N-channel field effect transistors having a high on-resistance, in other words, the field effect transistors $Q_{n81}$, $Q_{n82}$, and $Q_{n83}$ are connected in parallel.

Furthermore, the P-channel field effect transistor $Q_{p84}$ is connected between the N-channel field effect transistor $Q_{n82}$ and the low potential side power supply, and the P-channel field effect transistor $Q_{p85}$ is connected between the N-channel field effect transistor $Q_{n83}$ and the low potential side power supply. An inverted signal $xD_0$ of the control signal $D_0$ is applied to the gate electrode of the P-channel field effect transistor $Q_{p84}$, and an inverted signal $xD_1$ of the control signal $D_1$ is applied to the gate electrode of the P-channel field effect transistor $Q_{p85}$. The circuit operation according to the logic of the control signals (inverted signals) $xD_0$, $xD_1$ is the same as that in the case of the second stage CMOS inverter.

As described above, in the asymmetric delay element according to the thirteenth embodiment, the number of parallel connections of the field effect transistors having high on-resistance constituting the CMOS inverter is changed according to the logic of the control signals $D_0$, $D_1$. Specifically, in the CMOS inverters of the first and the third stages, the number of parallel connections of the P-channel field effect transistors is changed, and in the CMOS inverters of the second and fourth stages, the number of parallel connections of the N-channel field effect transistors is changed. FIG. 23B shows a truth table of the asymmetric delay element according to the thirteenth embodiment.

The number of parallel connections of the field effect transistors having high on-resistance constituting the CMOS inverter is changed according to the logic of the control signals $D_0$, $D_1$, so that the delay time can be controlled. In the truth table of FIG. 23B, if the delay time when the control signals $D_0$, $D_1$ are both logic 0 is $td_0$, the delay time when the control signal $D_0$ is logic 0 and the control signal $D_1$ is logic 1 is $td_1$, and the delay time when the control signals $D_0$, $D_1$ are both logic 1 is $td_2$, the magnitude relation $td_0 < td_1 < td_2$ is satisfied.

<Application Example of Technology According to the Present Disclosure>

The technology according to the present disclosure can be applied to various products. A more specific application example will be described below. For example, the technology according to the present disclosure may be realized as a distance measuring device mounted on any type of mobile body such as automobile, electric vehicle, hybrid electric vehicle, motorcycle, bicycle, personal mobility, airplane, drone, ship, robot, construction machine, agricultural machine (tractor).

(Mobile Body)

FIG. 25 is a block diagram showing a schematic configuration example of a vehicle control system 7000 which is an example of a mobile body control system to which the technology according to the present disclosure can be applied. The vehicle control system 7000 includes a plurality of electronic control units connected via a communication network 7010. In the example shown in FIG. 25, the vehicle control system 7000 includes a drive system control unit 7100, a body system control unit 7200, a battery control unit 7300, a vehicle exterior information detection unit 7400, a vehicle interior information detection unit 7500, and an integrated control unit 7600. The communication network 7010 connecting the plurality of control units may be, for example, an in-vehicle communication network conforming to an arbitrary standard such as the controller area network (CAN), the local interconnect network (LIN), the local area network (LAN), or the FlexRay (registered trademark).

Each control unit includes a microcomputer that performs operation processing according to various programs, a storage unit that stores programs executed by the microcomputer, parameters used for various operation, or the like, and a drive circuit that drives devices subjected to various control. Each control unit includes a network I/F for communicating with another control unit via the communication network 7010, and includes a communication I/F for communication by wired communication or wireless communication with vehicle interior or exterior device, a sensor, or the like. FIG. 25 shows, as functional configuration of the integrated control unit 7600, a microcomputer 7610, a general-purpose communication I/F 7620, a dedicated communication I/F 7630, a positioning unit 7640, a beacon reception unit 7650, vehicle interior equipment I/F 7660, an audio image output unit 7670, an in-vehicle network I/F 7680, and a storage unit 7690. Similarly, each of the other control units includes a microcomputer, a communication I/F, a storage unit, and the like.

The drive system control unit 7100 controls the operation of the device related to the drive system of the vehicle according to various programs. For example, the drive system control unit 7100 functions as a control device of a driving force generation device for generating a drive force of a vehicle such as an internal combustion engine or a driving motor, a drive force transmission mechanism for transmitting a drive force to wheels, a steering mechanism that adjusts a wheeling angle of the vehicle, a braking device that generates a braking force of the vehicle, and the like. The drive system control unit 7100 may have a function as a control device such as antilock brake system (ABS), or an electronic stability control (ESC).

A vehicle state detection unit 7110 is connected to the drive system control unit 7100. The vehicle state detection unit 7110 includes, for example, at least one of a gyro sensor that detects the angular velocity of the axis rotational motion of the vehicle body, an acceleration sensor that detects the acceleration of the vehicle, or a sensor for detecting an operation amount of an accelerator pedal, an operation amount of a brake pedal, steering of a steering wheel, an engine rotation speed, a wheel rotation speed, or the like. The drive system control unit 7100 performs operation processing using the signal input from the vehicle state detection unit 7110 and controls the internal combustion engine, the driving motor, the electric power steering device, the brake device, or the like.

The body system control unit 7200 controls the operation of various devices mounted on the vehicle according to various programs. For example, the body system control unit 7200 functions as a keyless entry system, a smart key system, a power window device, or a control device for various lamps such as a head lamp, a back lamp, a brake lamp, a turn indicator, or a fog lamp. In this case, radio waves transmitted from a portable device that substitutes keys or signals of various switches may be input to the body system control unit 7200. The body system control unit 7200 receives input of these radio waves or signals and controls a door lock device, a power window device, a lamp, or the like of the vehicle.

The battery control unit 7300 controls a secondary battery 7310 that is a power supply source of the driving motor according to various programs. For example, information such as battery temperature, a battery output voltage or remaining capacity of the battery is input to the battery control unit 7300 from the battery device including the secondary battery 7310. The battery control unit 7300 performs arithmetic processing using these signals and controls the temperature adjustment of the secondary battery 7310, or the cooling device or the like included in the battery device.

The vehicle exterior information detection unit 7400 detects information outside the vehicle equipped with the vehicle control system 7000. For example, at least one of the imaging unit 7410 or the vehicle exterior information detector 7420 is connected to the vehicle exterior information detection unit 7400. The imaging unit 7410 includes at least one of a time of flight (ToF) camera, a stereo camera, a monocular camera, an infrared camera, or other cameras. The vehicle exterior information detector 7420 includes, for example, at least one of an environmental sensor for detecting the current weather or climate, or an ambient information detection sensor for detecting another vehicle, an obstacle, a pedestrian, or the like around the vehicle equipped with the vehicle control system 7000.

The environmental sensor may be, for example, at least one of a raindrop sensor that detects rain, a fog sensor that detects mist, a sunshine sensor that detects sunshine degree, or a snow sensor that detects snowfall. The ambient information detection sensor may be at least one of an ultrasonic sensor, a radar device or a light detection and ranging, laser imaging detection and ranging (LIDAR) device. The imaging unit 7410 and the vehicle exterior information detector 7420 may be provided as independent sensors or devices, respectively, or may be provided as a device in which a plurality of sensors or devices are integrated.

Here, FIG. 26 shows an example of installation positions of the imaging unit 7410 and the vehicle exterior information detector 7420. The imaging units 7910, 7912, 7914, 7916, 7918 are provided at, for example, at least one of a front nose, a side mirror, a rear bumper, or a back door, of the vehicle 7900 or an upper portion of a windshield in the vehicle compartment. The imaging unit 7910 provided for the front nose and the imaging unit 7918 provided in the upper portion of the windshield in the vehicle compartment mainly acquire an image ahead of the vehicle 7900. The imaging units 7912, 7914 provided in the side mirror mainly acquire an image of the side of the vehicle 7900. The imaging unit 7916 provided in the rear bumper or the back door mainly acquires an image behind the vehicle 7900. The imaging unit 7918 provided on the upper portion of the windshield in the vehicle compartment is mainly used for detecting a preceding vehicle, a pedestrian, an obstacle, a traffic signal, a traffic sign, a lane, or the like.

Note that FIG. 26 shows an example of the imaging ranges of the imaging units 7910, 7912, 7914, 7916. An imaging range a indicates the imaging range of the imaging unit 7910 provided in the front nose, the imaging ranges b, c indicate the imaging ranges of the imaging units 7912, 7914 provided in the side mirror, and the imaging range d indicates the imaging range of the imaging unit 7916 provided in the rear bumper or the back door. For example, by superimposing the image data imaged by the imaging units 7910, 7912, 7914, 7916, an overhead view image of the vehicle 7900 viewed from above is obtained.

The vehicle exterior information detectors 7920, 7922, 7924, 7926, 7928, 7930 provided on the front, rear, side, or corner of the vehicle 7900 and the windshield in the upper portion of the vehicle compartment may be ultrasonic sensors or radar devices, for example. The vehicle exterior information detectors 7920, 7926, 7930 provided at the front nose, the rear bumper, or the back door of the vehicle 7900, and the upper portion of the windshield of the vehicle compartment may be the LIDAR device, for example. These vehicle exterior information detectors 7920 to 7930 are mainly used for detecting a preceding vehicle, a pedestrian, an obstacle, or the like.

Returning to FIG. 25, the description will be continued. The vehicle exterior information detection unit 7400 causes the imaging unit 7410 to image an image of the exterior of the vehicle and receives the imaged image data. Furthermore, the vehicle exterior information detection unit 7400 receives the detection information from the connected vehicle exterior information detector 7420. In a case where the vehicle exterior information detector 7420 is an ultrasonic sensor, a radar device or a LIDAR device, the exterior information detection unit 7400 transmits ultrasonic waves, electromagnetic waves, or the like, and receives information of the received reflected waves. The vehicle exterior information detection unit 7400 may perform object detection processing or distance detection processing of a person, a car, an obstacle, a sign, a character on a road surface, or the like, on the basis of the received information. The vehicle exterior information detection unit 7400 may perform environment recognition processing for recognizing rainfall, fog, road surface condition, or the like on the basis of the received information. The vehicle exterior information detection unit 7400 may calculate the distance to the object outside the vehicle on the basis of the received information.

Furthermore, the vehicle exterior information detection unit 7400 may perform image recognition processing of recognizing a person, a car, an obstacle, a sign, a character on a road surface, or the like, on the basis of the received image data, or distance detection processing. The vehicle exterior information detection unit 7400 performs processing such as distortion correction or positioning on the received image data and combines the image data imaged by different imaging units 7410 to generate an overhead view image or a panorama image. The vehicle exterior information detection unit 7400 may perform viewpoint conversion processing using image data imaged by different imaging units 7410.

The vehicle interior information detection unit 7500 detects vehicle interior information. For example, a driver state detection unit 7510 that detects the state of the driver is connected to the vehicle interior information detection unit 7500. The driver state detection unit 7510 may include a camera for imaging the driver, a biometric sensor for detecting the biological information of the driver, a microphone for collecting sound in the vehicle compartment, and the like. The biometric sensor is provided on, for example, a seating surface, a steering wheel or the like, and detects biometric information of an occupant sitting on a seat or a driver holding a steering wheel. The vehicle interior information detection unit 7500 may calculate the degree of fatigue or the degree of concentration of the driver on the basis of the detection information input from the driver state detection unit 7510, and may determine whether or not the driver is sleeping. The vehicle interior information detection unit 7500 may perform processing such as noise canceling processing on the collected sound signal.

The integrated control unit 7600 controls the overall operation of the vehicle control system 7000 according to various programs. An input unit 7800 is connected to the integrated control unit 7600. The input unit 7800 is realized by a device such as a touch panel, a button, a microphone, a switch or a lever that can be input operated by an occupant, for example. Data obtained by performing speech recognition on the sound input by the microphone may be input to the integrated control unit 7600. The input unit 7800 may be, for example, a remote control device using infrared rays or other radio waves, or an external connection device such as a mobile phone or a personal digital assistant (PDA) corresponding to the operation of the vehicle control system 7000. The input unit 7800 may be, for example, a camera, in which case the occupant can input information by gesture. Alternatively, data obtained by detecting the movement of the wearable device worn by the occupant may be input. Moreover, the input unit 7800 may include, for example, an input control circuit or the like that generates an input signal on the basis of information input by an occupant or the like using the input unit 7800 and outputs the input signal to the integrated control unit 7600. By operating the input unit 7800, an occupant or the like inputs various data or instructs processing operation to the vehicle control system 7000.

The storage unit 7690 may include a read only memory (ROM) that stores various programs to be executed by the microcomputer, and a random access memory (RAM) that stores various parameters, operation results, sensor values, or the like. Furthermore, the storage unit 7690 may be realized by a magnetic storage device such as a hard disc drive (HDD), a semiconductor storage device, an optical storage device, a magneto-optical storage device, or the like.

The general-purpose communication I/F 7620 is a general-purpose communication I/F that mediates communication with various devices existing in an external environment 7750. A cellular communication protocol such as global system of mobile communications (GSM) (registered trademark), WiMAX, long term evolution (LTE), or LTE-advanced (LTE-A), or other wireless communication protocols such as a wireless LAN (Wi-Fi (registered trademark)), or Bluetooth (registered trademark), may be implemented in the general-purpose communication I/F 7620. The general-purpose communication I/F 7620 may be connected to a device (for example, an application server or a control server) existing on an external network (for example, the Internet, a cloud network or a company specific network) via a base station or an access point, for example. Furthermore, the general-purpose communication I/F 7620 uses, for example, the peer to peer (P2P) technology to perform connection with a terminal existing in the vicinity of the vehicle (for example, a terminal of a driver, a pedestrian or a shop, or the machine type communication terminal (MTC).

The dedicated communication I/F 7630 is a communication I/F supporting a communication protocol formulated for use in a vehicle. For example, in the dedicated communication I/F 7630, a standard protocol such as the wireless access in vehicle environment (WAVE) that is combination of lower layer IEEE 802.11p and upper layer IEEE 1609, the dedicated short range communications (DSRC), or the cellular communication protocol may be implemented. Typically, the dedicated communication I/F 7630 performs V2X communication that is concept including one or more of a vehicle to vehicle communication, a vehicle to infrastructure communication, a vehicle to home communication, and a vehicle to pedestrian communication.

The positioning unit 7640 receives a global navigation satellite system (GNSS) signal from a GNSS satellite (for example, a GPS signal from a global positioning system (GPS) satellite) and performs positioning, to generate position information including the latitude, longitude, and altitude of the vehicle. Note that the positioning unit 7640 may specify the current position by exchanging signals with the wireless access point or may acquire the position information from a terminal such as a mobile phone, a PHS or a smartphone having a positioning function.

The beacon reception unit 7650 receives, for example, radio waves or electromagnetic waves transmitted from a radio station or the like installed on the road, and acquires information such as the current position, congestion, road closure or required time. Note that the function of the beacon reception unit 7650 may be included in the dedicated communication I/F 7630 described above.

The vehicle interior equipment I/F 7660 is a communication interface that mediates connection between the microcomputer 7610 and various interior equipment 7760 existing in the vehicle. The vehicle interior equipment I/F 7660 may establish a wireless connection using a wireless communication protocol such as wireless LAN, Bluetooth (registered trademark), near field communication (NFC), or a wireless USB (WUSB). Furthermore, the vehicle interior equipment I/F 7660 may establish wired connection such as a universal serial bus (USB), a high-definition multimedia interface (HDMI (registered trademark)), or a mobile high-definition link (MHL) via a connection terminal not shown (and a cable if necessary). The vehicle interior equipment 7760 may include, for example, at least one of a mobile device or a wearable device possessed by an occupant, or an information device carried in or attached to the vehicle. Furthermore, the vehicle interior equipment 7760 may include a navigation device that performs a route search to an arbitrary destination. The vehicle interior equipment I/F 7660 exchanges control signals or data signals with these vehicle interior equipment 7760.

The in-vehicle network I/F 7680 is an interface mediating communication between the microcomputer 7610 and the communication network 7010. The in-vehicle network I/F 7680 transmits and receives signals and the like according to a predetermined protocol supported by the communication network 7010.

The microcomputer 7610 of the integrated control unit 7600 controls the vehicle control system 7000 in accordance with various programs on the basis of information acquired via at least one of the general-purpose communication I/F 7620, the dedicated communication I/F 7630, the positioning unit 7640, the beacon reception unit 7650, the vehicle interior equipment I/F 7660, or the in-vehicle network I/F 7680. For example, the microcomputer 7610 may operate a control target value of the drive force generation device, the steering mechanism, or the braking device on the basis of acquired information inside and outside the vehicle, and output a control command to the drive system control unit 7100. For example, the microcomputer 7610 may perform cooperative control for the purpose of function realization of an advanced driver assistance system (ADAS) including collision avoidance or impact mitigation of the vehicle, follow-up running based on inter-vehicle distance, vehicle speed maintenance running, vehicle collision warning, vehicle lane departure warning, or the like. Furthermore, the microcomputer 7610 may perform cooperative control for the purpose of automatic driving or the like by which a vehicle autonomously runs without depending on the operation of the driver by controlling the drive force generation device, the steering mechanism, the braking device, or the like on the basis of the acquired information on the surroundings of the vehicle.

The microcomputer 7610 may generate three-dimensional distance information between the vehicle and a surrounding structure, an object, a person, or the like on the basis of the information acquired via at least one of the general-purpose communication I/F 7620, the dedicated communication I/F 7630, the positioning unit 7640, the beacon reception unit 7650, the vehicle interior equipment I/F 7660, or the in-vehicle network I/F 7680, and create local map information including peripheral information on the current position of the vehicle. Furthermore, the microcomputer 7610 may predict danger such as collision of a vehicle, approach of a pedestrian, or entry into a road where traffic is stopped, or the like on the basis of acquired information to generate a warning signal. The warning signal may be, for example, a signal for generating an alarm sound or for turning on a warning lamp.

The audio image output unit 7670 transmits an output signal of at least one of audio and image to an output device capable of visually or audibly notifying the occupant of the vehicle or the outside of the vehicle, of information. In the example of FIG. 25, as an output device, an audio speaker 7710, a display unit 7720, and an instrument panel 7730 are illustrated. The display unit 7720 may include at least one of an on-board display or a head-up display, for example. The display unit 7720 may have an augmented reality (AR) display function. The output device may be other devices including a wearable device such as a headphone, a spectacular display worn by an occupant, a projector, a lamp, or the like other than these devices. In a case where the output device is a display device, the display device visually displays the result obtained by the various processing performed by the microcomputer 7610 or the information received from the other control unit in various formats such as text, image, table, or graph. Furthermore, in a case where the output device is an audio output device, the audio output device converts an audio signal including reproduced audio data, acoustic data, or the like into an analog signal, and outputs the result audibly.

Note that, in the example shown in FIG. 25, at least two control units connected via the communication network 7010 may be integrated as one control unit. Alternatively, each control unit may be constituted by a plurality of control units. Moreover, the vehicle control system 7000 may include another control unit not shown. Furthermore, in the above description, some or all of the functions carried out by any one of the control units may be performed by the other control unit. That is, as long as information is transmitted and received via the communication network 7010, predetermined operation processing may be performed by any control unit. Similarly, a sensor or device connected to any of the control units may be connected to another control unit, and a plurality of control units may transmit and receive detection information to and from each other via the communication network 7010.

An example of the vehicle control system to which the technology according to the present disclosure can be applied has been described above. For example, the technology according to the present disclosure can be applied to the imaging units 7910, 7912, 7914, 7916, 7918 and the vehicle exterior information detectors 7920, 7922, 7924, 7926, 7928, 7930, among the configurations described above. In addition, by applying the technology according to the present disclosure, the circuit area per pixel can be reduced, so that it is possible to reduce the size of the imaging unit and the vehicle exterior information detector.

<Configuration that the Present Disclosure can Take>

The present disclosure can adopt the following configuration.

<<A. Light Receiving Device>>

[A-1] A light receiving device including:
- a pixel array unit having a plurality of pixels each including a light receiving unit that generates a signal in response to reception of photons;
- a first switch unit that recharges the light receiving unit; and
- a recharge control unit that controls the first switch unit in accordance to output of the light receiving unit,
- the recharge control unit being shared among the plurality of pixels.

[A-2] The light receiving device described in [A-1] described above, in which,
- in a case where photons are incident on one or more light receiving units among light receiving units of a plurality of pixels that share the recharge control unit, the recharge control unit performs recharging for all of the light receiving units of the plurality of pixels.

[A-3] The light receiving device described in [A-2] described above, in which
- the recharge control unit has an OR circuit that takes the OR of logic signals whose logic is inverted at the time when photons are incident on one or more light receiving units, and performs recharging in response to an OR signal of the OR circuit.

[A-4] The light receiving device described in any of [A-1] to [A-3] described above, in which
- the light receiving unit includes a single photon avalanche diode.

[A-5] The light receiving device described in [A-4] described above, in which
- a signal is retrieved from a cathode electrode side of the single photon avalanche diode.

[A-6] The light receiving device described in [A-4] described above, in which
- a signal is retrieved from an anode electrode side of the single photon avalanche diode.

[A-7] The light receiving device described in [A-3] described above, including
- a level conversion unit that converts the level of the OR signal of the OR circuit is provided, in which a conversion result of the level conversion unit is output as information for detecting the photon incidence timing.

[A-8] The light receiving device described in [A-3] described above, including
- an exclusive OR circuit that retrieves the exclusive OR of logic signals whose logic is inverted at the time when photons are incident on one or more light receiving units, and a level conversion unit that converts the level of the exclusive OR signal of the exclusive OR circuit, in which
- a conversion result of the level conversion unit is output as information for detecting the photon incidence timing.

[A-9] The light receiving device described in [A-3] described above, including
- an adder is provided that adds the number of photons incident on a plurality of pixels sharing the recharge control unit, in which an addition result of the adder is output as information for detecting the number of incident photons.

[A-10] The light receiving device described in [A-3] described above, in which
- each of the input signals of the OR circuit has a configuration in which a waveform shaping unit is provided that performs processing for increasing the pulse width and outputs the result.

[A-11] The light receiving device described in [A-4] described above, including
- a quenching circuit that lowers the applied voltage with respect to the single photon avalanche diode to a breakdown voltage.

[A-12] The light receiving device described in [A-11] described above, in which
- the quenching circuit is constituted by a second switch unit connected in parallel to a first switch unit, and operates according to the output of the light receiving unit.

[A-13] The light receiving device described in [A-1] described above, in which
- the recharge control unit has a recharge signal generation circuit that generates a recharge signal for driving the first switch unit, and
- the recharge signal generation circuit includes a ring oscillator.

[A-14] The light receiving device described in [A-13] described above, in which
- the ring oscillator includes an asymmetric delay element having different rising delay time and falling delay time.

[A-15] The light receiving device described in [A-14] described above, in which
- the asymmetric delay element includes a CMOS inverter, and has a P-channel field effect transistor and an N-channel field effect transistor having different sizes.

[A-16] The light receiving device described in [A-15] described above, in which
- the delay time of the asymmetric delay element is variable.

[A-17] The light receiving device described in [A-16] described above, in which
- the number of series connections of the transistor having higher on-resistance among the P-channel field effect transistor and the N-channel field effect transistor is variable, and the delay time is set according to the number of series connections.

[A-18] The light receiving device described in [A-16] described above, in which
- the number of parallel connections of the transistor having higher on-resistance among the P-channel field effect transistor and the N-channel field effect transistor is variable, and the delay time is set according to the number of parallel connections.

[A-19] The light receiving device described in any of [A-1] to [A-18] described above, including
a stacked structure in which a first semiconductor substrate on which the light receiving unit is arranged, and a second semiconductor substrate on which the recharge control unit is arranged are stacked.

<<B. Distance Measuring Device>>

[B-1] A distance measuring device including a light source that irradiates an object to be measured with light, and a light receiving device that receives light reflected by the object to be measured, in which
the light receiving device includes:
a pixel array unit arranged with a plurality of pixels each including a light receiving unit;
a first switch unit that recharges the light receiving unit; and
a recharge control unit that controls the first switch unit in accordance to output of the light receiving unit,
the recharge control unit being shared among the plurality of pixels.

[B-2] The distance measuring device described in [B-1] described above, in which,
in a case where photons are incident on one or more light receiving units among light receiving units of a plurality of pixels that share the recharge control unit, the recharge control unit performs recharging for all of the light receiving units of the plurality of pixels.

[B-3] The distance measuring device described in [B-2] described above, in which
the recharge control unit has an OR circuit that takes the OR of logic signals whose logic is inverted at the time when photons are incident on one or more light receiving units, and performs recharging in response to an OR signal of the OR circuit.

[B-4] The distance measuring device described in any of [B-1] to [B-3] described above, in which
the light receiving unit includes a single photon avalanche diode.

[B-5] The distance measuring device described in [B-4] described above, in which
a signal is retrieved from a cathode electrode side of the single photon avalanche diode.

[B-6] The distance measuring device described in [B-4] described above, in which
a signal is retrieved from an anode electrode side of the single photon avalanche diode.

[B-7] The distance measuring device described in [B-3] described above, in which
a level conversion unit that converts the level of the OR signal of the OR circuit is provided, and a conversion result of the level conversion unit is output as information for detecting photon incidence timing.

[B-8] The distance measuring device described in [B-3] described above, in which
an exclusive OR circuit that retrieves exclusive OR of logic signals whose logic is inverted at the time when photons are incident on one or more light receiving units, and a level conversion unit that converts the level of the exclusive OR signal of the exclusive OR circuit are provided, and
the conversion result of the level conversion unit is output as information for detecting the photon incidence timing.

[B-9] The distance measuring device described in [B-3] described above, in which
an adder is provided that adds the number of photons incident on a plurality of pixels sharing the recharge control unit, and an addition result of the adder is output as information for detecting the number of incident photons.

[B-10] The distance measuring device described in [B-3] described above, in which
each of the input signals of the OR circuit has a configuration in which a waveform shaping unit is provided that performs processing for increasing the pulse width and outputs the result.

[B-11] The distance measuring device described in [B-4] described above, including
a quenching circuit that lowers the applied voltage with respect to the single photon avalanche diode to a breakdown voltage.

[B-12] The distance measuring device described in [B-11] described above, in which
the quenching circuit is constituted by a second switch unit connected in parallel to a first switch unit, and operates according to the output of the light receiving unit.

[B-13] The distance measuring device described in [B-1] described above, in which
the recharge control unit has a recharge signal generation circuit that generates a recharge signal for driving the first switch unit, and
the recharge signal generation circuit includes a ring oscillator.

[B-14] The distance measuring device described in [B-13] described above, in which
the ring oscillator includes an asymmetric delay element having different rising delay time and falling delay time.

[B-15] The distance measuring device described in [B-14] described above, in which
the asymmetric delay element includes a CMOS inverter, and has a P-channel field effect transistor and an N-channel field effect transistor having different sizes.

[B-16] The distance measuring device described in [B-15] described above, in which
the delay time of the asymmetric delay element is variable.

[B-17] The distance measuring device described in [B-16] described above, in which
the number of series connections of the transistor having higher on-resistance among the P-channel field effect transistor and the N-channel field effect transistor is variable, and the delay time is set according to the number of series connections.

[B-18] The distance measuring device described in [B-16] described above, in which
the number of parallel connections of the transistor having higher on-resistance among the P-channel field effect transistor and the N-channel field effect transistor is variable, and the delay time is set according to the number of parallel connections.

[B-19] The distance measuring device described in any of [B-1] to [B-18] described above, including
a stacked structure in which a first semiconductor substrate on which the light receiving unit is arranged, and a second semiconductor substrate on which the recharge control unit is arranged are stacked.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Distance measuring device
10 Subject (object to be measured)
20 Light source
21 Laser driver
22 Laser light source
23 Diffusing lens
30 Light receiving device
31 Light receiving lens
32 Light sensor
33 Circuit unit
40 Control unit
50($50_1$ to $50_4$) Pixel
51($51_1$ to $51_4$) SPAD sensor
60 Circuit unit
61($61_1$ to $61_4$) First switch unit
62 Second switch unit
63($63_1$ to $63_4$) Comparator
64 Recharge control unit
65 Level conversion unit
71 Sensor chip
72 Circuit chip

The invention claimed is:

1. A light receiving device comprising:
a pixel array unit having a plurality of pixels and having a corresponding plurality of light receiving units each generates a signal according to reception of photons;
a plurality of first switch units corresponding to the plurality of light receiving units, each of the plurality of first switch units recharging a corresponding one of the plurality of light receiving units; and
a recharge control unit that controls the plurality of first switch units according to one or more outputs of one or more of the plurality of light receiving units, the recharge control unit being shared among the plurality of pixels, wherein the recharge control unit comprises:
an OR circuit having a plurality of inputs; and
an inverter having an input and an output wherein at least one of the plurality of inputs of the OR circuit is electrically connected to the output of the inverter and the at least one light receiving unit is electrically connected to the input of the inverter wherein the OR circuit of the recharge control unit takes OR of logic signals whose logic is inverted at the time when photons are incident on one or more light receiving units, and performs recharging in response to an OR signal of the OR circuit.

2. The light receiving device according to claim 1, wherein in a case where photons are incident on one or more light receiving units among light receiving units of the plurality of pixels that share the recharge control unit, the recharge control unit performs recharging for all of the light receiving units of the plurality of pixels.

3. The light receiving device according to claim 2, wherein the recharge control unit comprises:
an OR circuit having a plurality of inputs; and
an inverter having an input and an output wherein at least one of the plurality of inputs of the OR circuit is electrically connected to the output of the inverter and the at least one light receiving unit is electrically connected to the input of the inverter wherein the OR circuit of the recharge control unit takes OR of logic signals whose logic is inverted at the time when photons are incident on one or more light receiving units, and performs recharging in response to an OR signal of the OR circuit.

4. The light receiving device according to claim 3, further comprising a level conversion unit that converts a level of the OR signal of the OR circuit, wherein a conversion result of the level conversion unit is output as information for detecting photon incidence timing.

5. The light receiving device according to claim 3, further comprising an exclusive OR circuit that retrieves exclusive OR of logic signals whose logic is inverted at the time when photons are incident on one or more light receiving units, and a level conversion unit that converts a level of the exclusive OR signal of the exclusive OR circuit, wherein a conversion result of the level conversion unit is output as information for detecting the photon incidence timing.

6. The light receiving device according to claim 3, further comprising an adder that adds a number of photons incident on a plurality of pixels sharing the recharge control unit, wherein an addition result of the adder is output as information for detecting the number of incident photons.

7. The light receiving device according to claim 3, wherein each of the plurality of inputs of the OR circuit has a waveform shaping unit that performs processing for increasing a pulse width and outputs a result.

8. The light receiving device according to claim 1, wherein the light receiving unit includes a single photon avalanche diode.

9. The light receiving device according to claim 8, wherein a signal is retrieved from a cathode electrode side of the single photon avalanche diode.

10. The light receiving device according to claim 8, wherein a signal is retrieved from an anode electrode side of the single photon avalanche diode.

11. The light receiving device according to claim 8, further comprising a quenching circuit that lowers an applied voltage with respect to the single photon avalanche diode to a breakdown voltage.

12. The light receiving device according to claim 11, wherein the quenching circuit comprises a second switch unit connected in parallel to the first switch unit, and operates according to an output of the light receiving unit.

13. The light receiving device according to claim 1, wherein the recharge control unit comprises a recharge signal generation circuit that generates a recharge signal for driving the first switch unit, and the recharge signal generation circuit includes a ring oscillator.

14. The light receiving device according to claim 13, wherein the ring oscillator comprises asymmetric delay elements having different rising delay time and falling delay time.

15. The light receiving device according to claim 14, wherein the asymmetric delay element comprises a CMOS inverter, and has a P-channel field effect transistor and an N-channel field effect transistor having different sizes.

16. The light receiving device according to claim 15, wherein the delay time of the asymmetric delay element is variable.

17. The light receiving device according to claim 16, wherein a number of series connections of the transistor having higher on-resistance among the P-channel field effect transistor and the N-channel field effect transistor is variable, and the delay time is set according to the number of series connections.

18. The light receiving device according to claim 16, wherein a number of parallel connections of the transistor having higher on-resistance among the P-channel field effect transistor and the N-channel field effect transistor is variable, and the delay time is set according to the number of parallel connections.

19. The light receiving device according to claim 1, further comprising a stacked structure in which a first semiconductor substrate on which the light receiving unit is arranged, and a second semiconductor substrate on which the recharge control unit is arranged are stacked.

20. A distance measuring device comprising a light source that irradiates an object to be measured with light, and a light receiving device that receives light reflected by the object to be measured, wherein the light receiving device includes: a pixel array unit arranged with a plurality of pixels having a corresponding plurality of light receiving units; a plurality of first switch units corresponding to the plurality of light receiving units, each of the plurality of first switch units recharging a corresponding one of the plurality of light receiving units; and a recharge control unit that controls the plurality of first switch units according to one or more outputs of the plurality of light receiving units, the recharge control unit being shared among the plurality of pixels, wherein the recharge control unit comprises: an OR circuit having a plurality of inputs; and an inverter having an input and an output wherein at least one of the plurality of inputs of the OR circuit is electrically connected to the output of the inverter and the at least one light receiving unit is electrically connected to the input of the inverter wherein the OR circuit of the recharge control unit takes OR of logic signals whose logic is inverted at the time when photons are incident on one or more light receiving units, and performs recharging in response to an OR signal of the OR circuit.

* * * * *